(12) United States Patent
Lee et al.

(10) Patent No.: US 12,354,560 B2
(45) Date of Patent: Jul. 8, 2025

(54) DISPLAY DEVICE WITH IMPROVED DISPLAY QUALITY

(71) Applicant: Samsung Display Co., Ltd., Yongin-Si (KR)

(72) Inventors: Sunhwa Lee, Yongin-si (KR); Gyungsoon Park, Seoul (KR); Jaeyong Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 440 days.

(21) Appl. No.: 17/547,331

(22) Filed: Dec. 10, 2021

(65) Prior Publication Data

US 2022/0319440 A1 Oct. 6, 2022

(30) Foreign Application Priority Data

Apr. 1, 2021 (KR) .................. 10-2021-0042731

(51) Int. Cl.
*G09G 3/3275* (2016.01)
*G09G 3/3266* (2016.01)

(52) U.S. Cl.
CPC ......... *G09G 3/3275* (2013.01); *G09G 3/3266* (2013.01); *G09G 2320/0238* (2013.01); *G09G 2330/021* (2013.01); *G09G 2340/0435* (2013.01)

(58) Field of Classification Search
CPC ........... G09G 3/035; G09G 3/30–3291; G09G 3/3666; G09G 3/3674–3677; G09G 2300/0804; G09G 2300/0426; G09G 2310/02–0221; G09G 2310/0281; G09G 2310/0286; G09G 2310/04; G09G 2320/0238; G09G 2330/021; G09G 2340/0435; G09G 2380/02; G11C 7/1009; G11C 19/18–188; G11C 19/28–287
See application file for complete search history.

(56) References Cited

U.S. PATENT DOCUMENTS

| | | | |
|---|---|---|---|
| 10,276,121 B2 | 4/2019 | Kim et al. | |
| 10,950,157 B1* | 3/2021 | Kim | G09G 3/20 |
| 2012/0162238 A1* | 6/2012 | Fleck | G09G 3/20 345/545 |
| 2015/0243203 A1* | 8/2015 | Kim | G09G 3/3291 345/212 |
| 2017/0084222 A1* | 3/2017 | Sun | G09G 3/32 |
| 2017/0186373 A1* | 6/2017 | Nishikawa | G09G 3/3266 |
| 2018/0190181 A1* | 7/2018 | Zhao | G09G 3/2096 |

(Continued)

FOREIGN PATENT DOCUMENTS

| KR | 10-2017-0079997 A | 7/2017 |
|---|---|---|
| KR | 10-2017-0105174 A | 9/2017 |
| KR | 10-2022-0000023 A | 1/2022 |

*Primary Examiner* — Keith L Crawley
(74) *Attorney, Agent, or Firm* — Innovation Counsel LLP

(57) ABSTRACT

A display device may include a display panel, a data driving circuit, and a scan driving circuit which outputs first scan signals and second scan signals. The scan driving circuit includes a plurality of stages. Each of the stages may include a masking circuit outputting a first scan signal to a first output terminal, a driving circuit outputting a second scan signal to a second output terminal, and an auxiliary circuit including an auxiliary transistor which is a normally closed and connected between the masking circuit and the driving circuit.

20 Claims, 15 Drawing Sheets

(56) References Cited

U.S. PATENT DOCUMENTS

| | | | |
|---|---|---|---|
| 2018/0240382 A1* | 8/2018 | Choi | G09G 3/3696 |
| 2019/0189233 A1* | 6/2019 | Su | G09G 3/20 |
| 2021/0027697 A1* | 1/2021 | Yoon | G09G 3/20 |
| 2021/0027720 A1* | 1/2021 | Park | G09G 3/3266 |
| 2021/0407427 A1 | 12/2021 | Lee et al. | |
| 2022/0215791 A1* | 7/2022 | Lai | G09G 3/2092 |
| 2023/0005430 A1* | 1/2023 | Li | G09G 3/2096 |

* cited by examiner

DISPLAY DEVICE WITH IMPROVED DISPLAY QUALITY

CROSS-REFERENCE TO RELATED APPLICATIONS

This U.S. non-provisional patent application claims priority under 35 U.S.C. § 119 to Korean Patent Application No. 10-2021-0042731, filed on Apr. 1, 2021, in the Korean Intellectual Property Office, the entire contents of which are hereby incorporated by reference.

BACKGROUND

The present disclosure relates to a display device with improved display quality.

An organic light emitting display device, one of the display devices, displays an image using an organic light emitting diode in which light is produced by recombination of electrons and holes. The organic light emitting display device has various advantageous features such as a fast response speed and a low driving power consumption.

The display device includes a display panel displaying an image, a scan driving circuit sequentially providing scan signals to scan lines in the display panel, and a data driving circuit providing data signals to data lines in the display panel.

Especially, the scan driving circuit includes a plurality of stages which are used to output the scan signal to a corresponding scan line in synchronization with a specific clock. The scan driving circuit repeatedly executes an operation of sequentially outputting a scan signal to all stages from the first stage to the last stage with the same period every frame.

SUMMARY

An embodiment of the inventive concept provides a display device with improved display quality.

According to an embodiment of the inventive concept, a display panel including a plurality of data lines, a plurality of first scan lines, a plurality of second scan lines, and a plurality of pixels, a data driving circuit providing a plurality of data voltages to the plurality of data lines, a scan driving circuit including a plurality of stages and outputting a plurality of first scan signals to the plurality of first scan lines and outputting a plurality of second scan signal to the plurality of second scan lines, and a driving controller controlling the data driving circuit and the scan driving circuit. Each of the plurality of stages may include a masking circuit outputting a first scan signal to a first output terminal, a driving circuit outputting a second scan signal to a second output terminal, and an auxiliary circuit including an auxiliary transistor which is a normally turned-on state and connected between the masking circuit and the driving circuit.

In an embodiment, the driving circuit may include an output transistor which is connected between the second output terminal and a first voltage terminal receiving a first voltage, and includes a gate electrode connected to a first Q node, and the masking circuit may include an output masking transistor which is connected between the first output terminal and the first voltage terminal, and includes a gate electrode connected to a second Q node that is different from the first Q node.

In an embodiment, the auxiliary transistor may be connected between the first Q node and the second Q node, and comprises a gate electrode connected to the first voltage terminal.

In an embodiment, the driving circuit may further include a capacitor connected to the first Q node, and the auxiliary circuit may further include an auxiliary capacitor connected to the second Q node.

In an embodiment, the capacitor and the auxiliary capacitor may have the same size.

In an embodiment, a first electrode of the capacitor may be connected to the first Q node, a first electrode of the auxiliary capacitor may be connected to the second Q node, and a second electrode of the capacitor may be connected to a second electrode of the auxiliary capacitor.

In an embodiment, the display panel may include a first display region which is operated with a first driving frequency and a second display region which is operated with the first driving frequency or a second driving frequency which is different from the first driving frequency depending on an operation mode of the display device.

In an embodiment, the plurality of stages may include a first stage, a second stage, and a third stage, the first stage outputs a first-first scan signal and a first-second scan signal to the first display region, the second stage outputs a second-first scan signal to the second display region and outputs a second-second scan signal to the first display region, and the third stage outputs a third-first scan signal and a third-second scan signal to the second display region.

In an embodiment, the second stage may be configured to activate the second-second scan signal and to inactivate the second-first scan signal when the first display region is operated with the first driving frequency and the second display region is operated with the second driving frequency lower than the first driving frequency.

In an embodiment, the masking circuit of the first stage may further include a masking transistor that is connected between a second voltage terminal which receives a second voltage different from the first voltage and the first output terminal.

In an embodiment, the masking circuit of each of the second and third stages may further include a masking transistor that is connected between an input terminal which receives a masking signal controlling an operation of the masking circuit and the first output terminal.

According to an embodiment of the inventive concept, a display device may include a display panel including a display region, the display panel comprising a plurality of first scan lines receiving a plurality of first scan signals, respectively, a plurality of second scan lines receiving a plurality of second scan signals, respectively, a plurality of data lines, and a plurality of pixels, the display region comprising a first display region which is operated with a first driving frequency and a second display region which is operated with the first driving frequency or a second driving frequency depending on an operation mode of the display device, the first driving frequency and the second driving frequency being different from each other, a first stage outputting a first-first scan signal and a first-second scan signal to the first display region, a second stage outputting a second-first scan signal to the second display region and outputting a second-second scan signal to the first display region, and a third stage outputting a third-first scan signal and a third-second scan signal to the second display region. The second stage may include a masking circuit outputting the second-first scan signal to a first output terminal, a driving circuit outputting the second-second scan signal to a second output terminal, and an auxiliary circuit including an auxiliary transistor which is connected between the masking circuit and the driving circuit.

In an embodiment, the driving circuit may include an output transistor which is connected between the second output terminal and a first voltage terminal receiving a first voltage and includes a gate electrode connected to a first Q node. The masking circuit may include an output masking transistor which is connected between the first output terminal and the first voltage terminal and includes a gate electrode connected to a second Q node different from the first Q node.

In an embodiment, the auxiliary transistor may be connected between the first Q node and the second Q node and includes a gate electrode connected to the first voltage terminal.

In an embodiment, the driving circuit may further include a capacitor connected to the first Q node, the auxiliary circuit may further include an auxiliary capacitor connected to the second Q node, and the capacitor and the auxiliary capacitor may have the same size.

In an embodiment, a first electrode of the capacitor may be connected to the first Q node, a first electrode of the auxiliary capacitor may be connected to the second Q node, and a second electrode of the capacitor may be connected to a second electrode of the auxiliary capacitor.

According to an embodiment of the inventive concept, a display device may include a display panel including a plurality of data lines, a plurality of first scan lines, a plurality of second scan lines, and a plurality of pixels, a data driving circuit providing a plurality of data voltages to the plurality of data lines, a scan driving circuit outputting a plurality of first scan signals to the plurality of first scan lines, outputting a plurality of second scan signals to the plurality of second scan lines, and comprising a plurality of stages. Each of the plurality of stages may include a masking circuit outputting a first scan signal to a first output terminal and comprising an output masking transistor connected to the first output terminal, a driving circuit outputting a second scan signal to a second output terminal and comprising an output transistor connected to the second output terminal, and an auxiliary circuit including an auxiliary transistor which is connected between a gate electrode of the output transistor and a gate electrode of the output masking transistor, and an auxiliary capacitor which is connected to the gate electrode of the output masking transistor.

In an embodiment, the driving circuit may further include a capacitor connected to the gate electrode of the output transistor, and the capacitor and the auxiliary capacitor may have the same size.

In an embodiment, the capacitor and the auxiliary capacitor may be connected to each other.

In an embodiment, the display panel may include a first display region which is operated with a first driving frequency and a second display region which is operated with the first driving frequency or a second driving frequency lower than the first driving frequency depending on an operation mode of the display device.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
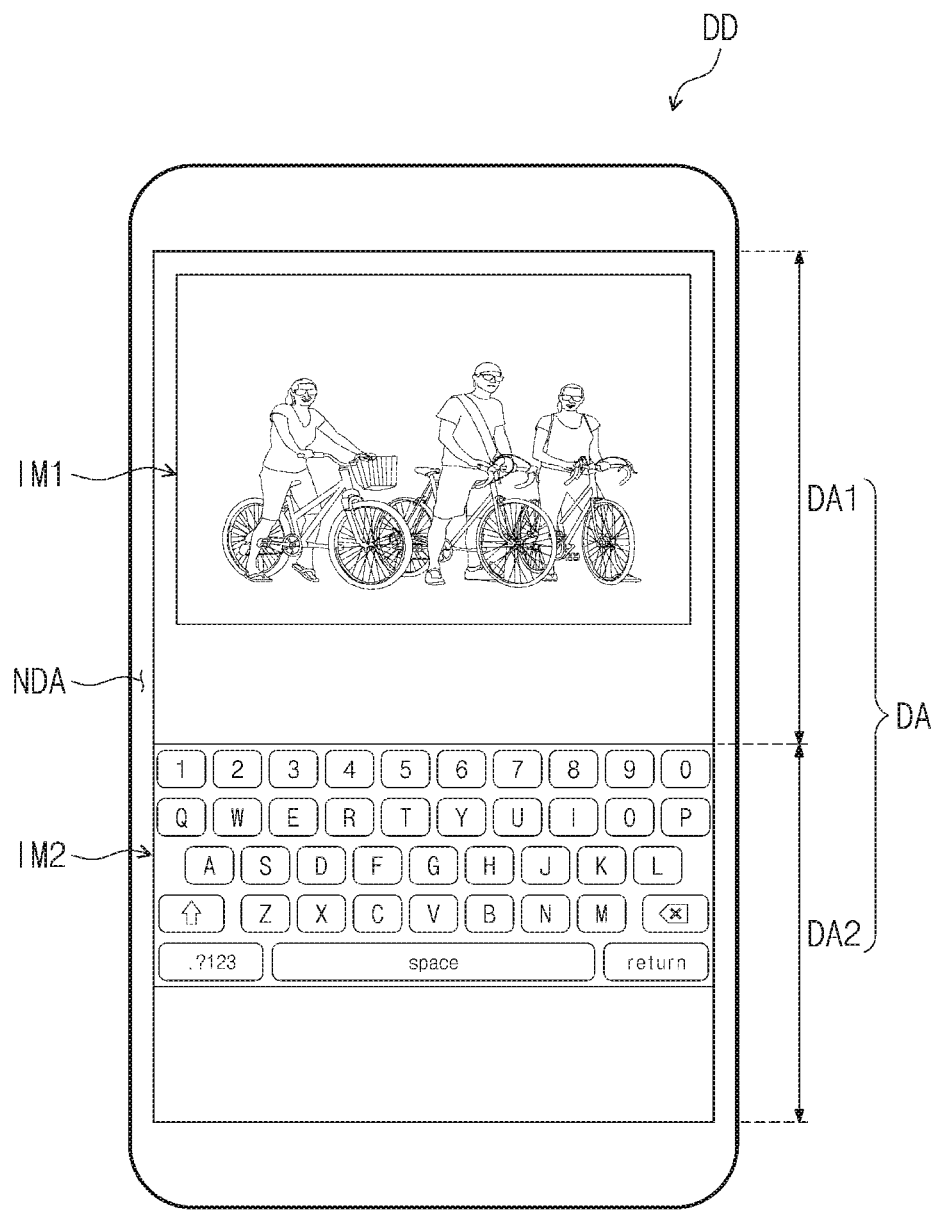
FIG. 1 is a plan view illustrating a display device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The term of "part" or "unit" used in the embodiment may be a software component or a hardware component, which is configured to execute a specific function. The hardware component may include a field programmable gate array (FPGA) or an application specific integrated circuit (ASIC). The software component may refer to data used by executable code and/or data, which are stored in an addressable storage medium and are used by the executable code. Thus, the software components may be, for example, object-oriented software components, class components, and work components and may include processes, functions, properties, procedures, subroutines, program code segments, drivers, firmwares, microcodes, circuits, data, database, data structures, tables, arrays, or variables.

FIG. 1 is a plan view illustrating a display device according to an embodiment of the inventive concept.

Referring to FIG. 1, a display device DD may be activated by an electrical signal applied thereto. For example, the display device DD may be a cellular phone, a tablet, a car navigation system, a gaming machine, or a wearable device but is not limited to these examples. FIG. 1 illustrates an example, in which the display device DD is a cellular phone.

The display device DD may include a display region DA and a non-display region NDA. The display region DA may be used to display images IM1 and IM2, whereas the non-display region NDA may not display images. The non-display region NDA may enclose the display region DA. But the inventive concept is not limited thereto, and the shapes of the display region DA and the non-display region NDA may be variously changed. For example, the non-display region NDA may be omitted or may be disposed near only one side of the display region DA.

The display region DA may be parallel to a plane or a flat surface that is defined by a first direction DR1 and a second direction DR2, but the inventive concept is not limited to this example. The display device DD may include a curved display region or a three-dimensional display region. The three-dimensional display region may include a plurality of display regions, which are configured to display images in respectively different directions. A thickness direction of the display device DD will be referred to as a third direction DR3. Hereinafter, the third direction DR3 may be used to differentiate a front or top surface of each layer or unit from a back or bottom surface. Furthermore, the expression "when viewed in a plan view" in the present specification will be used to describe a structure viewed in the third direction DR3.

The display region DA of the display device DD may include a first display region DA1 and a second display region DA2. In a specific application program, the first display region DA1 may be used to display a first image IM1, and the second display region DA2 may be used to display a second image IM2. For example, the first image IM1 may be a video image, and the second image IM2 may be a still image or a text image having a long refresh period.

The display device DD may be selectively operated in a first or second mode or in a multi-frequency mode. When the display device DD is in the first mode, a driving frequency of the first display region DA1 may be equal to a driving frequency of the second display region DA2, and when the display device DD is in the second mode, the first driving frequency of the first display region DA1 may be different from the second driving frequency of the second display region DA2. For example, in the case where the first image IM1 is a video image and the second image IM2 is a still image, the first driving frequency of the first display region DA1 may be higher than the second driving frequency of the second display region DA2. Since the display device DD is operated in the multi-frequency mode, it may be possible to improve the display quality of the video image and to reduce the overall amount of power consumption.

Figure 2A:
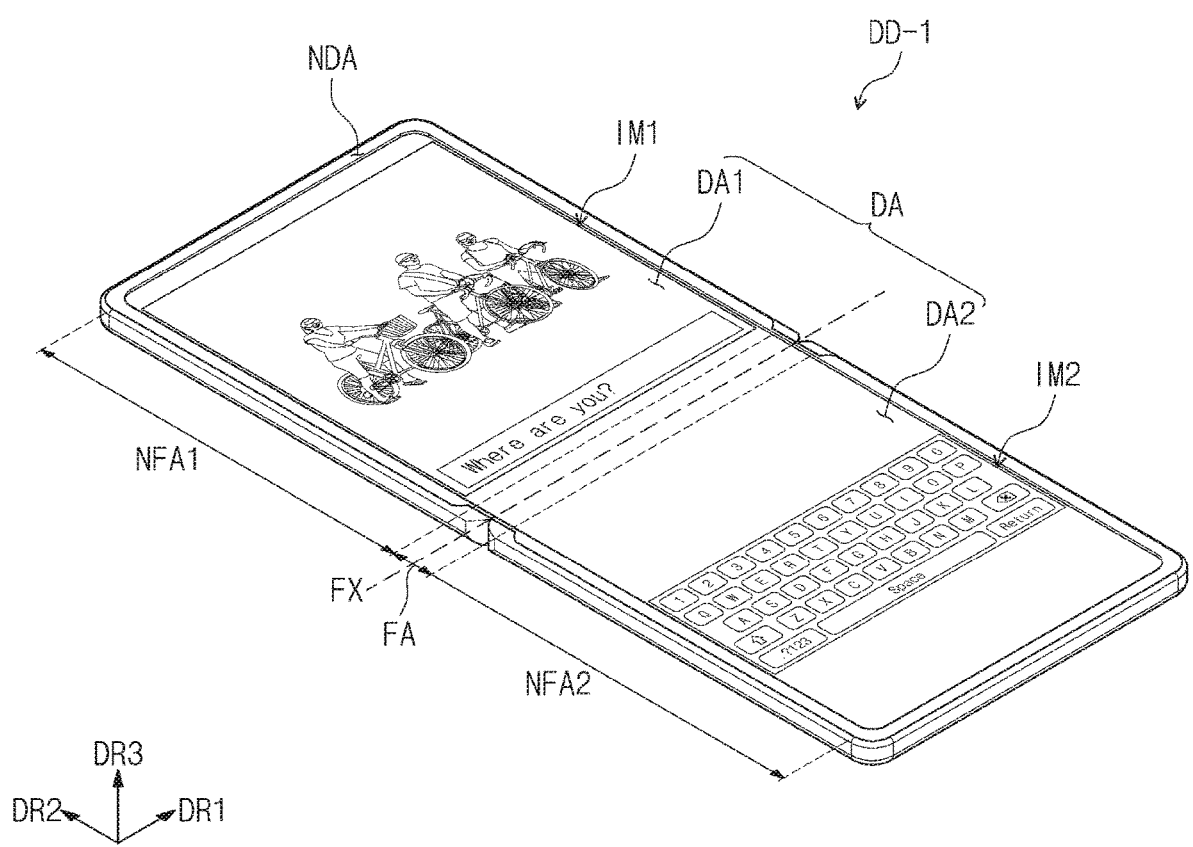
FIGS. 2A and 2B are perspective views illustrating a display device according to an embodiment of the inventive concept.
Figure 2B:
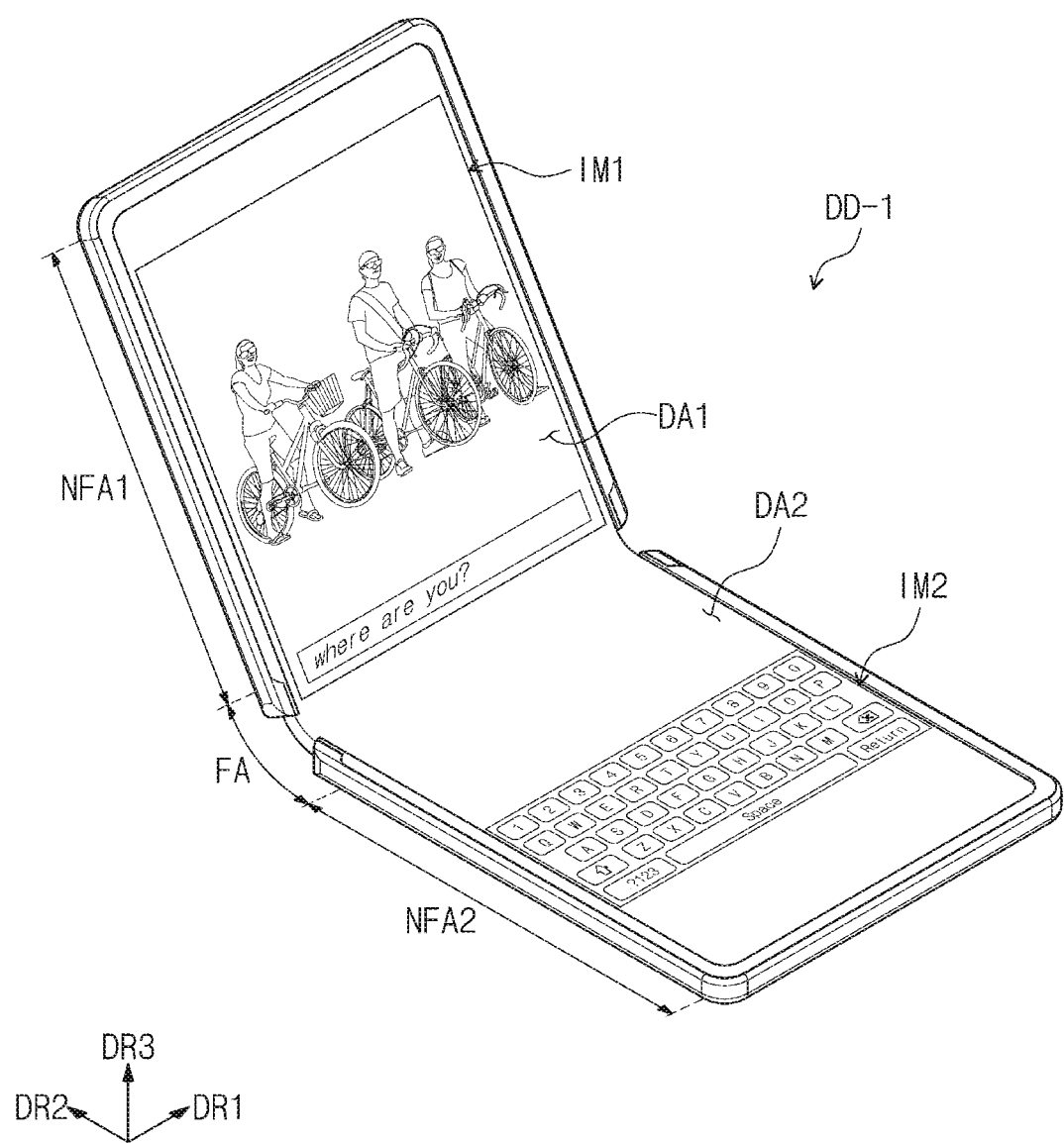

FIGS. 2A and 2B are perspective views illustrating a display device according to an embodiment of the inventive concept. FIG. 2A illustrates a display device DD-1 in an unfolded state, and FIG. 2B illustrate the display device DD-1 which is in a partially folded state or is folded at a specific angle.

Referring to FIGS. 2A and 2B, the display device DD-1 may include a folding or foldable region FA and a plurality of non-folding regions NFA1 and NFA2. The non-folding regions NFA1 and NFA2 may include a first non-folding region NFA1 and a second non-folding region NFA2. The folding region FA may be disposed between the first non-folding region NFA1 and the second non-folding region NFA2.

As shown in FIGS. 2A and 2B, the folding region FA may be folded along a folding axis FX extending parallel to the first direction DR1. The folding region FA may extend in the first direction DR1. The folding region FA may be folded to have a specific curvature and a specific curvature radius. When the display device DD-1 is completely folded in an inner-folding manner, the first non-folding region NFA1 and the second non-folding region NFA2 may face each other and a display surface DS may not be exposed to the outside.

In an embodiment, the display device DD-1 may be folded in an outer-folding manner that the display surface DS is exposed to the outside. In an embodiment, the display device DD-1 may be configured to alternately and repeatedly perform the unfolding operation and the inner-folding or outer-folding operation, but the inventive concept is not limited to this example. In an embodiment, the display device DD-1 may be configured to selectively perform one of the unfolding operation, the inner-folding operation, and the outer-folding operation.

The display region DA may be divided into the first display region DA1 and the second display region DA2 based on the position of the folding axis FX. When the display device DD-1 is in a partially folded state or is folded at a specific angle, the first image IM1 may be displayed on the first display region DA1 and the second image IM2 may be displayed on the second display region DA2. For example, the first image IM1 may be a video image and the second image IM2 may be a still image or a text image having a long refresh period. Here, the specific angle may be defined as an angle between the first and second display regions DA1 and DA2 and may be within a range from 0° to 180°, but the inventive concept is not limited to this range.

The display device DD-1 may be selectively operated in a first mode or a second mode or in a multi-frequency mode. When the display device DD-1 is in the first mode, a driving frequency of the first display region DA1 may be equal to a driving frequency of the second display region DA2, and, when the display device DD-1 is in the second mode, the first driving frequency of the first display region DA1 may be different from the second driving frequency of the second display region DA2. Since the display device DD-1 is operated in the multi-frequency mode, it may be possible to improve the display quality of the video image and to reduce the overall amount of power consumption.

Figure 3A:
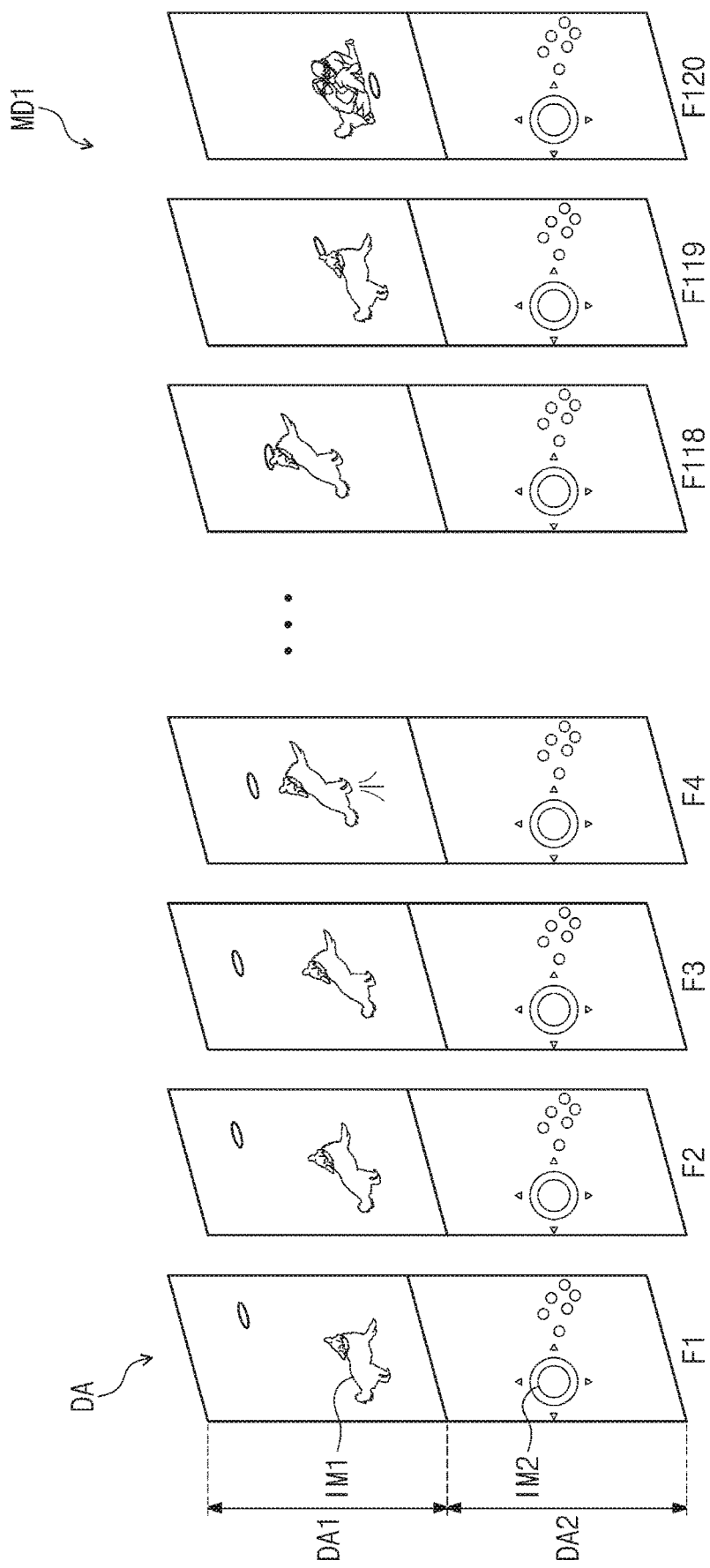
FIG. 3A is a diagram illustrating an operation of a display device according to an embodiment of the inventive concept.
Figure 3B:
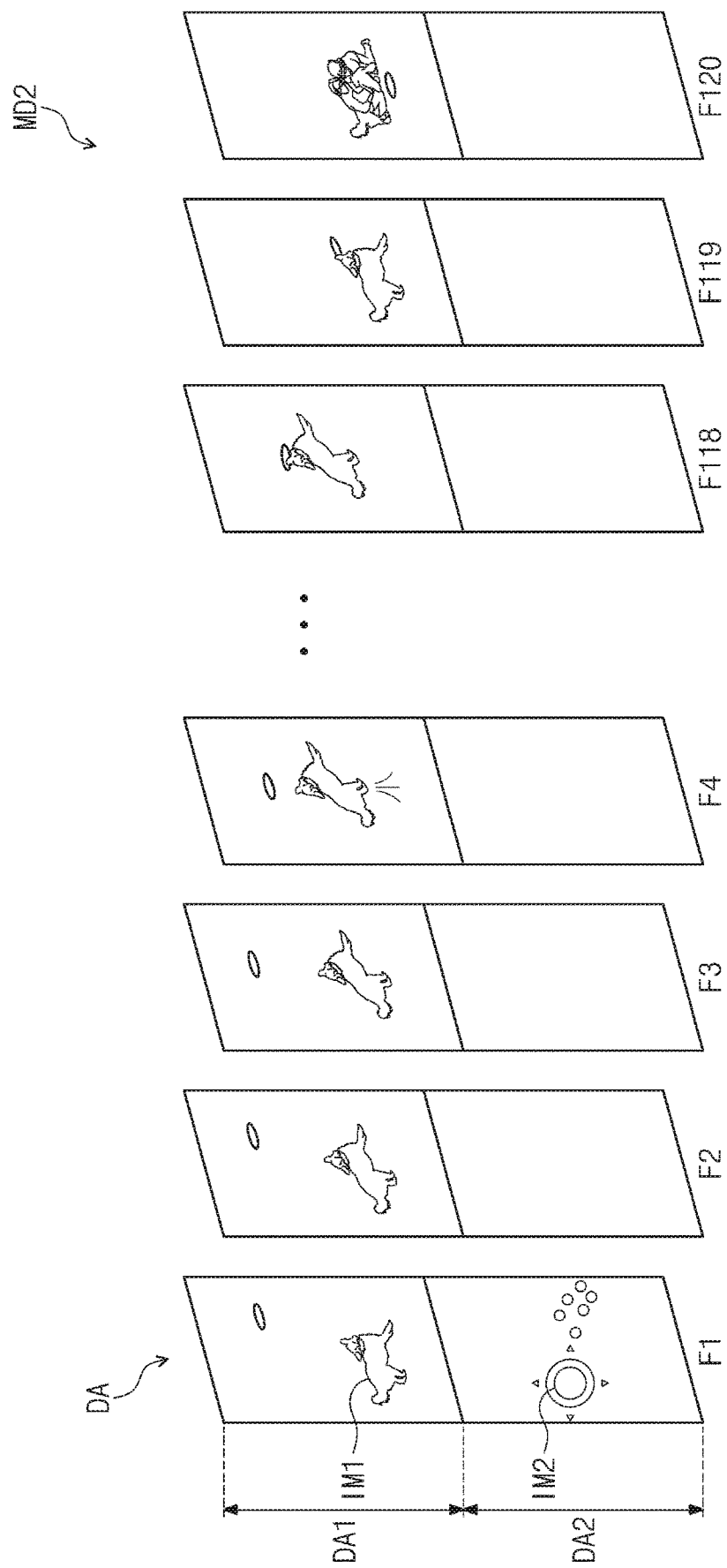
FIG. 3B is a diagram illustrating an operation of a display device according to an embodiment of the inventive concept.

FIG. 3A is a diagram illustrating an operation of a display device according to an embodiment of the inventive concept. FIG. 3B is a diagram illustrating an operation of a display device according to an embodiment of the inventive concept.

Referring to FIGS. 1, 3A, and 3B, the display device DD may be selectively operated in a first mode MD1 or a second mode MD2. The first mode MD1 may be referred to as a general mode. The second mode MD2 may be referred to as a low-power mode or a multi-frequency mode.

Referring to FIG. 3A, in the first mode MD1, the driving frequency of the first display region DA1 may be equal to the driving frequency of the second display region DA2. For example, the first and second display regions DA1 and DA2 may have the driving frequency of 120 Hz, but the inventive concept is not limited to this example. In the case where the driving frequency of each of the first and second display regions DA1 and DA2 is 120 Hz, each of the first and second display regions DA1 and DA2 may be refreshed with a new image signal every 8.34 milliseconds.

Referring to FIG. 3B, in the second mode MD2, the driving frequency of the first display region DA1 may be different from the driving frequency of the second display region DA2. The driving frequency of the second display region DA2 may be lower than the driving frequency of the first display region DAL For example, the driving frequency of the first display region DA1 may be 120 Hz and the driving frequency of the second display region DA2 may be 1 Hz. This means that, in the second mode MD2, the first display region DA1 may be refreshed with a new image signal every 8.34 milliseconds and the second display region DA2 may be refreshed with a new image signal every one second.

Figure 4:
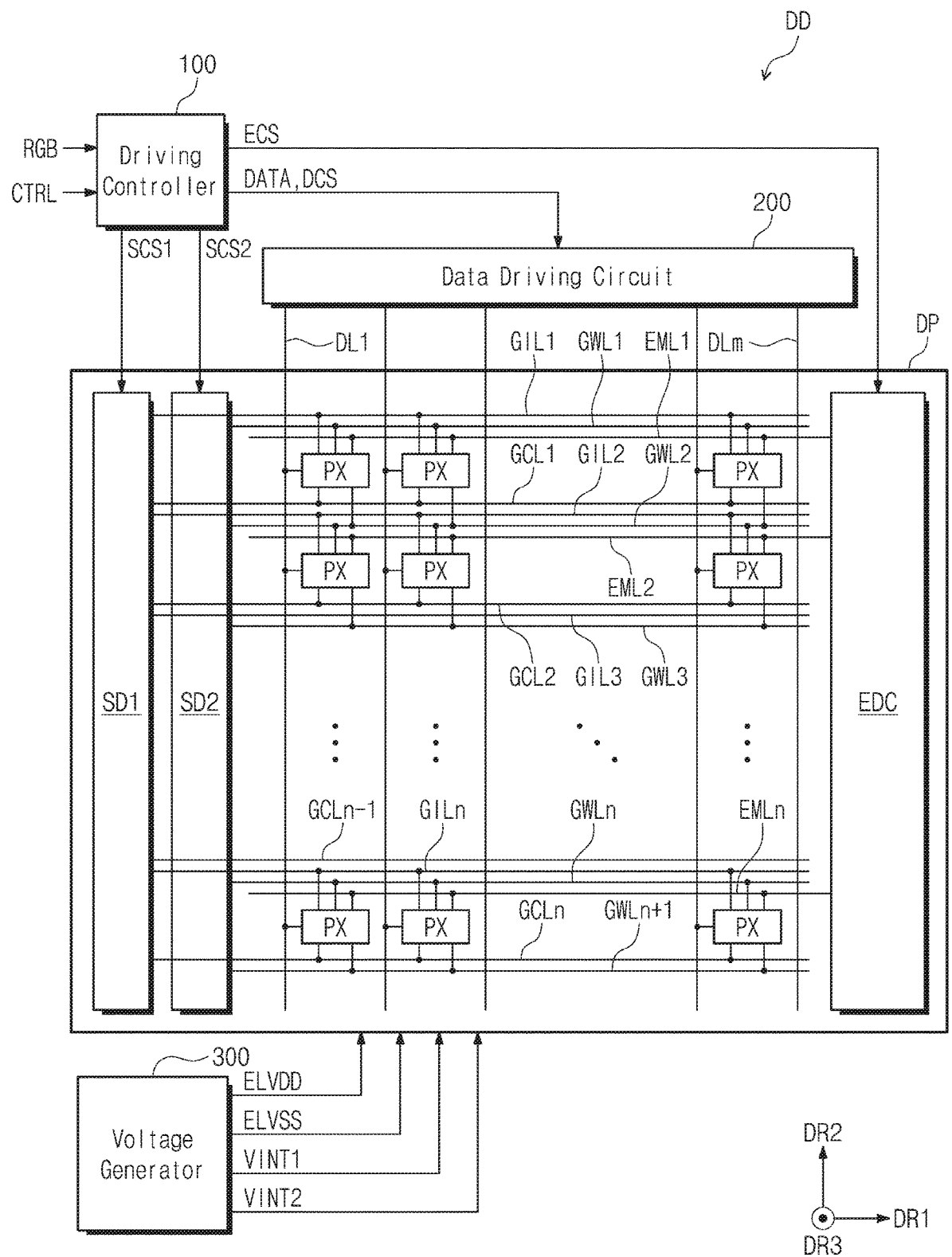
FIG. 4 is a block diagram illustrating a display device according to an embodiment of the inventive concept.

FIG. 4 is a block diagram illustrating a display device according to an embodiment of the inventive concept.

Referring to FIG. 4, the display device DD may include a display panel DP, a driving controller 100, a data driving circuit 200, and a voltage generator 300.

The driving controller 100 may receive an image signal RGB and a control signal CTRL. The driving controller 100 may convert the image signal RGB to an image data signal DATA whose data format is suitable for the interfacing with the data driving circuit 200. The driving controller 100 may output a first scan control signal SCS1, a second scan control signal SCS2, a data control signal DCS, and an emission control signal ECS.

The data driving circuit 200 may receive the data control signal DCS and the image data signal DATA from the driving controller 100. The data driving circuit 200 may convert the image data signal DATA to data signals and then may output the data signals to a plurality of data lines DL1-DLm which will be described below. The data signal may be an analog voltage corresponding to a gradation value of the image data signal DATA.

The voltage generator 300 may generate various voltages required for the operation of the display panel DP. In an embodiment, the voltage generator 300 may generate a first driving voltage ELVDD, a second driving voltage ELVSS, a first initialization voltage VINT1, and a second initialization voltage VINT2.

The display panel DP may include first scan lines GIL1-GILn, second scan lines GCL1-GCLn, third scan lines GWL1-GWLn, emission control lines EML1-EMLn, data lines DL1-DLm, and pixels PX. The first scan lines GIL1-GILn, the second scan lines GCL1-GCLn, and the third scan lines GWL1-GWLn may be referred to as initialization scan lines GIL1-GILn, compensation scan lines GCL1-GCLn, and write scan lines GWL1-GWLn, respectively.

The display panel DP may further include a first scan driving circuit SD1, a second scan driving circuit SD2, and an emission driving circuit EDC. In an embodiment, the first scan driving circuit SD1 and the second scan driving circuit SD2 may be provided along a first side of the display panel DP, and the emission driving circuit EDC may be provided along a second side of the display panel DP that is opposite to the first side. That is, the first scan driving circuit SD1 and the second scan driving circuit SD2 may be arranged to be spaced apart from the emission driving circuit EDC with the pixels PX interposed therebetween in the first direction DR1. FIG. 4 illustrates an example in which the first scan driving circuit SD1 and the second scan driving circuit SD2 are only arranged adjacent to the first side of the display panel DP, but the inventive concept is not limited to this example. In addition, the first scan driving circuit SD1 and the second scan driving circuit SD2 are illustrated as separate circuits in FIG. 4, but the inventive concept is not limited to this example. For example, the first scan driving circuit SD1 and the second scan driving circuit SD2 may constitute a single circuit that is called a scan driving circuit.

The first scan lines GIL1-GILn and the second scan lines GCL1-GCLn may extend from the first scan driving circuit SD1 in the first direction DR1. The third scan lines GWL1-GWLn may extend from the second scan driving circuit SD2 in the first direction DR1. The emission control lines EML1-EMLn may extend from the emission driving circuit EDC in a direction opposite to the first direction DR1.

The first scan lines GIL1-GILn, the second scan lines GCL1-GCLn, the third scan lines GWL1-GWLn, and the emission control lines EML1-EMLn may be arranged to be spaced apart from each other in the second direction DR2. The data lines DL1-DLm may extend from the data driving circuit 200 in the second direction DR2 and may be arranged to be spaced apart from each other in the first direction DR1.

Each of the pixels PX may be electrically connected to a corresponding one of the first scan lines GIL1-GILn, a corresponding one of the second scan lines GCL1-GCLn, a corresponding pair of the third scan lines GWL1-GWLn, a corresponding one of the emission control lines EML1-EMLn, and a corresponding one of the data lines DL1-DLm, respectively.

Each of the pixels PX may be electrically connected to four scan lines. For example, as shown in FIG. 4, the pixels in the first row may be connected to the scan lines GIL1, GCL1, GWL1, and GWL2. The pixels in the second row may be connected to the scan lines GIL2, GCL2, GWL2, and GWL3. However, this is just one example, and the method of connecting the pixels to the scan lines is not limited to this example.

Each of the pixels PX may include a light-emitting diode ED (e.g., see FIG. 5) and a pixel circuit part PXC (e.g., see FIG. 5), which is used to control an emission operation of the light-emitting diode. The pixel circuit part PXC (e.g., see FIG. 5) may include a plurality of transistors and at least one capacitor. At least one of the first scan driving circuit SD1, the second scan driving circuit SD2, and the emission driving circuit EDC may include transistors which are formed by the same process as that for the pixel circuit part PXC.

Each of the pixels PX may receive the first driving voltage ELVDD, the second driving voltage ELVSS, the first initialization voltage VINT1, and the second initialization voltage VINT2 from the voltage generator 300.

The first scan driving circuit SD1 may receive the first scan control signal SCS1 from the driving controller 100. The first scan driving circuit SD1 may be configured to output first scan signals to the first scan lines GIL1-GILn and to output second scan signals to the second scan lines GCL1-GCLn in response to the first scan control signal SCS1. Since two different kinds of circuit signals (e.g., the first and second scan signals) are provided from one scan driving circuit (e.g., the first scan driving circuit SD1), an area of a dead space of the display device DD may be reduced. The circuit structure and operation of the first scan driving circuit SD1 will be described in more detail below.

The second scan driving circuit SD2 may receive the second scan control signal SCS2 from the driving controller 100. The second scan driving circuit SD2 may output third scan signals to the third scan lines GWL1-GWLn in response to the second scan control signal SCS2.

The emission driving circuit EDC may receive the emission control signal ECS from the driving controller 100. The emission driving circuit EDC may output emission control signals to the emission control lines EML1-EMLn in response to the emission control signal ECS.

The driving controller 100 may control the first scan driving circuit SD1 to operate the display device DD in the first or second mode based on the control signal CTRL and/or the image signal RGB. For example, the first scan control signal SCS1 may include a masking signal. The masking signal may be a signal that is used to mask the first scan signals, which is supplied to the second display region DA2 (e.g., see FIG. 1), to a specific level. The masking signal may be provided to some of driving stages.

Figure 5:
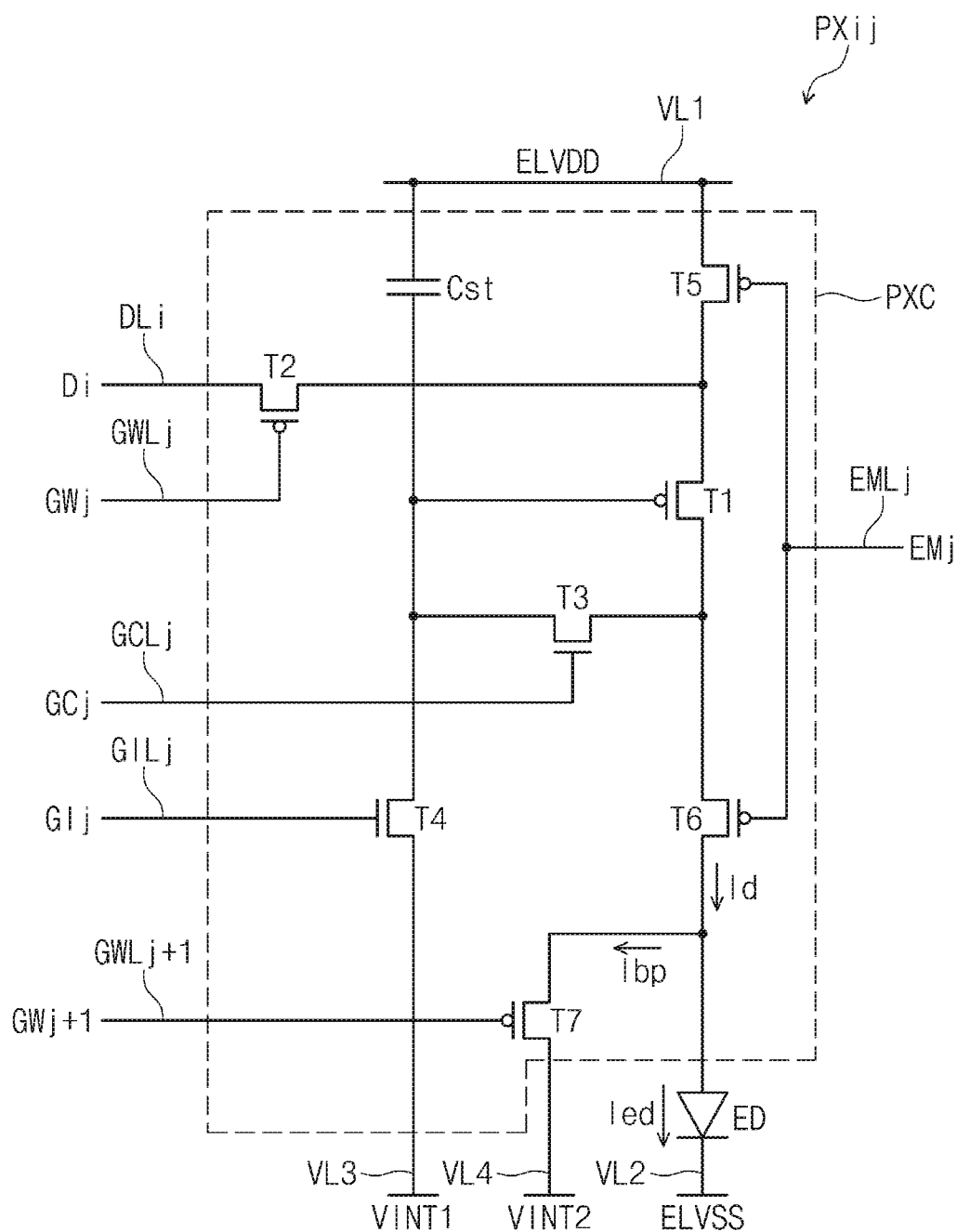
FIG. 5 is an equivalent circuit diagram of a pixel according to an embodiment of the inventive concept.

FIG. 5 is an equivalent circuit diagram of a pixel according to an embodiment of the inventive concept.

Referring to FIGS. 4 and 5, FIG. 5 illustrates an equivalent circuit diagram of a pixel PXij which is coupled to an i-th data line DLi, a j-th first scan line GILj, a j-th second scan line GCLj, j-th and (j+1)-th third scan lines GWLj and GWLj+1, a j-th emission control line EMLj that are respectively included in the data lines DL1-DLm, the first scan lines GIL1-GILn, the second scan lines GCL1-GCLn, the third scan lines GWL1-GWLn, and the emission control lines EML1-EMLn shown in FIG. 1.

The pixel PXij may include the pixel circuit part PXC and one light-emitting diode ED which is electrically connected to the pixel circuit part PXC. The light-emitting diode ED may be an organic light emitting diode, an inorganic light-emitting diode, or an organic/inorganic light-emitting diode, but the inventive concept is not limited to these examples.

The pixel circuit part PXC may include first to seventh transistors T1, T2, T3, T4, T5, T6, and T7 and a capacitor Cst. Each of the pixels PX shown in FIG. 4 may be configured to have the same circuit structure as that of the pixel PXij of FIG. 5.

Each of the first, second, fifth, sixth, and seventh transistors T1, T2, T5, T6, and T7 may be a p-type transistor having a low-temperature polycrystalline silicon (LTPS) semiconductor layer, and each of the third and fourth transistors T3 and T4 may be an n-type transistor having a semiconductor layer made of an oxide semiconductor material. However, the structure of the pixel circuit portion PXC is not limited to that shown in FIG. 5. The pixel circuit part PXC of FIG. 5 may be just one example, and the structure of the pixel circuit part PXC may be variously modified. For example, all of the first to seventh transistors T1-T7 may be p-type transistors or may be n-type transistors. Alternatively, at least one of the first to seventh transistors T1-T7 may be an n-type transistor, and the others may be p-type transistors.

For convenience in description, the j-th first scan line GILj, the j-th second scan line GCLj, the j-th third scan line GWLj, (j+1)-th third scan line GWLj+1 and the j-th emission control line EMLj will be referred to as a first scan line GILj, a second scan line GCLj, a third scan line GWLj, a fourth scan line GWLj+1, and an emission control line EMLj, respectively.

The first to fourth scan lines GILj, GCLj, GWLj, and GWLj+1 may be respectively used to transmit first to fourth scan signals GIj, GCj, GWj, and GWj+1 to the pixel PXij. The first scan signal GIj may be used to turn on or off the fourth transistor T4 which is the n-type transistor. The second scan signal GCj may be used to turn on or off the third transistor T3 which is the n-type transistor. The third scan signal GWj may be used to turn on or off the second transistor T2 which is the p-type transistor. The fourth scan signal GWj+1 may be used to turn on or off the seventh transistor T7 which is the p-type transistor.

The emission control line EMLj may be used to transmit an emission control signal EMj for controlling an emission operation of the light-emitting diode ED in the pixel PXij. The emission control signal EMj, which is transmitted through the emission control line EMLj, may have a different waveform from the scan signals GIj, GCj, GWj, and GWj+1 which are transmitted through the first to fourth scan lines GILj, GCLj, GWLj, and GWLj+1.

The data line DLi may be used to deliver a data signal Di. The data signal Di may have a voltage level that corresponds to the image signal RGB to be input to the display device DD (e.g., see FIG. 4). First, second, third, and fourth driving voltage lines VL1, VL2, VL3, and VL4 may be used to deliver the first driving voltage ELVDD, the second driving voltage ELVSS, the first initialization voltage VINT1, and the second initialization voltage VINT2. The first initialization voltage VINT1 and the second initialization voltage VINT2 may have different voltage levels from each other. In an embodiment, the first initialization voltage VINT1 and the second initialization voltage VINT2 may have the same voltage level.

The first transistor T1 may include a first electrode connected to the first driving voltage line VL1 through the fifth transistor T5, a second electrode electrically connected to an anode of the light-emitting diode ED through the sixth transistor T6, and a gate electrode connected to one electrode of the capacitor Cst. If the data signal Di is provided to the first transistor T1 through the data line DLi by a switching operation of the second transistor T2, the first transistor T1 may supply a driving current Id to the light-emitting diode ED in response to the emission control signal EMj.

The second transistor T2 may include a first electrode connected to the data line DLi, a second electrode connected to the first electrode of the first transistor T1, and a gate electrode connected to the third scan line GWLj. If the second transistor T2 is turned on in response to the third scan signal GWj transmitted through the third scan line GWLj, the data signal Di, which is transmitted through the data line DLi, may be provided to the first electrode of the first transistor T1.

The third transistor T3 may include a first electrode connected to the gate electrode of the first transistor T1, a second electrode connected to the second electrode of the first transistor T1, and a gate electrode connected to the second scan line GCLj. If the third transistor T3 is turned on by the second scan signal GCj transmitted through the second scan line GCLj, the gate and second electrodes of the first transistor T1 may be connected to each other, and, in this case, the first transistor T1 may behave like a diode.

The fourth transistor T4 may include a first electrode connected to the gate electrode of the first transistor T1, a second electrode connected to the third driving voltage line VL3 applied with the first initialization voltage VINT1, and a gate electrode connected to the first scan line GILj. If the fourth transistor T4 is turned on in response to the first scan signal GIj transmitted through the first scan line GILj, the first initialization voltage VINT1 may be applied to the gate electrode of the first transistor T1, and, in this case, the fourth transistor T4 may execute an initialization operation of initializing the voltage of the gate electrode of the first transistor T1.

The fifth transistor T5 may include a first electrode connected to the first driving voltage line VL1, a second electrode connected to the first electrode of the first transistor T1, and a gate electrode connected to the emission control line EMLj.

The sixth transistor T6 may include a first electrode connected to the second electrode of the first transistor T1, a second electrode connected to the anode of the light-emitting diode ED, and a gate electrode connected to the emission control line EMLj.

The fifth transistor T5 and the sixth transistor T6 may be simultaneously turned on in response to the emission control signal EMj, which is transmitted through the j-th emission control line EMLj, and, in this case, the first driving voltage ELVDD which is controlled by the first transistor may be provided to the light-emitting diode ED.

The seventh transistor T7 may include a first electrode connected to the fourth driving voltage line VL4, a second electrode connected to the second electrode of the sixth transistor T6, and a gate electrode connected to the fourth scan line GWLj+1. In an embodiment, the first electrode of the seventh transistor T7 may be commonly connected to the third driving voltage line VL3 with the second electrode of the fourth transistor T4.

As described above, a first electrode of the capacitor Cst may be connected to the gate electrode of the first transistor T1 and a second electrode of the capacitor Cst may be connected to the first driving voltage line VL1. A cathode of the light-emitting diode ED may be connected to the second driving voltage line VL2 which is used to deliver the second driving voltage ELVSS. The structure of the pixel PXij according to an embodiment of the inventive concept is not limited to that shown in FIG. 5, and the numbers of the transistors and the capacitor, which are included in each pixel PXij, and the connection structure therebetween may be variously changed.

Figure 6:
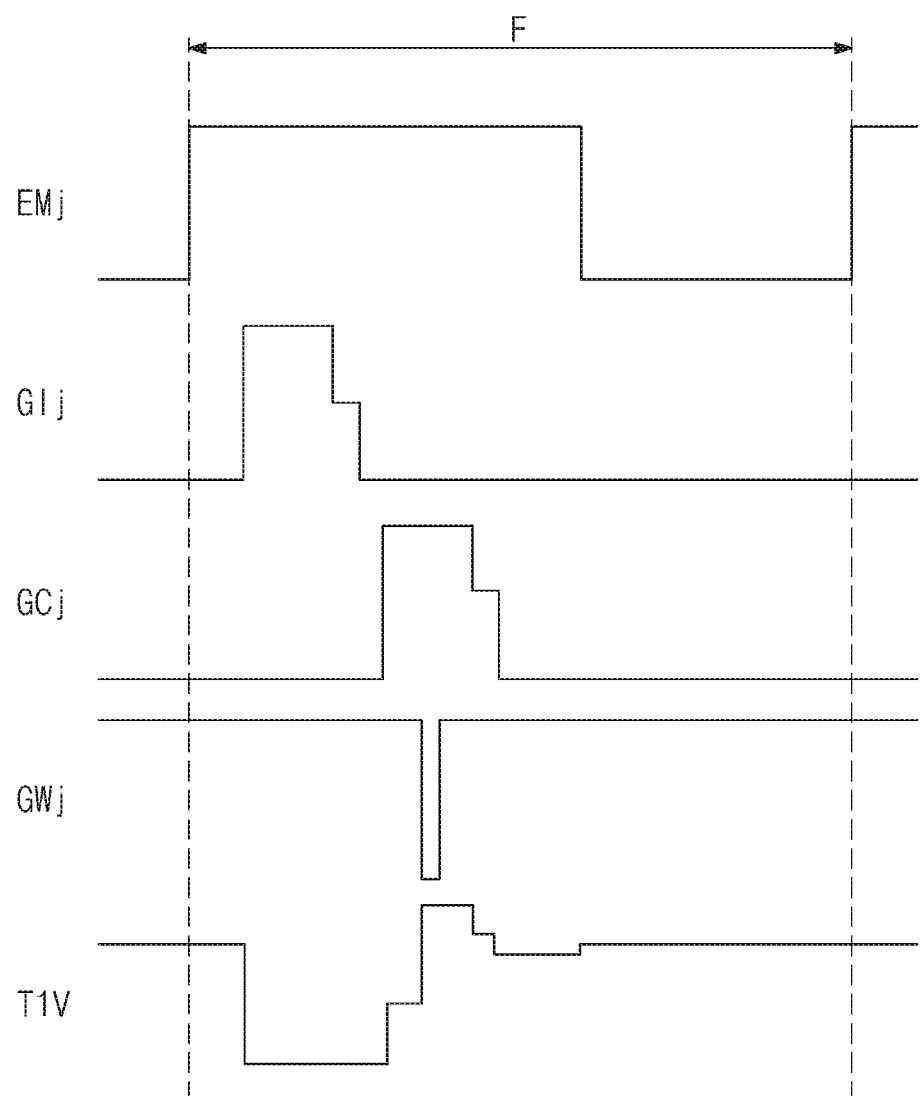
FIG. 6 is a timing diagram illustrating an operation of the pixel of FIG. 5.

FIG. 6 is a timing diagram illustrating an operation of the pixel of FIG. 5.

Referring to FIGS. 5 and 6, the first scan signal GIj of high level may be applied to the fourth transistor T4 through the first scan line GILj during an initialization period in each frame F. The fourth transistor T4 may be turned on in response to the first scan signal GIj of the high level, and in this case, the first initialization voltage VINT1 may be applied to the gate electrode of the first transistor T1 through the fourth transistor T4. As a result, the gate electrode of the first transistor T1 may be initialized.

Next, during a data programming and compensation period, if the second scan signal GCj of high level is supplied to the third transistor T3 through the second scan line GCLj, the third transistor T3 may be turned on. In this case, the first transistor T1 may behave like a diode in a forward bias condition, because the third transistor T3 is turned on.

If the third scan signal GWj of low level is applied to the second transistor T2 through the third scan line GWLj, the second transistor T2 may be turned on. Then, a voltage, which is lowered from a voltage level of the data signal Di supplied from the data line DLi by a threshold voltage of the first transistor T1, may be applied to the gate electrode of the first transistor T1. Thereafter, a kickback voltage may be produced by a change in voltage level of the second scan signal GCj, and a level of a voltage T1V applied to the gate electrode of the first transistor T1 may be changed.

The first driving voltage ELVDD and the voltage T1V of the gate electrode of the first transistor T1 may be applied to two ends of the capacitor Cst, and an amount of electric charges corresponding to a voltage difference between the two ends of the capacitor Cst may be stored in the capacitor Cst.

The seventh transistor T7 may be turned on by the fourth scan signal GWj+1 of low level transmitted through the fourth scan line GWLj+1. The seventh transistor T7 may be used to improve a black representation ability of the pixel PX. In detail, if the seventh transistor T7 is turned on, a parasitic capacitor (not shown) of the light-emitting diode ED may be discharged. In this case, a part of the driving current Id serving as a bypass current Ibp may be discharged through the seventh transistor T7. Then, it may be possible to prevent a leakage current of the first transistor T1 from causing an unintended light emission of the light-emitting diode ED when it is necessary to display an image of black brightness, and thereby to improve the black representation ability of the display device.

FIG. 5 illustrates an example in which the control electrode of the seventh transistor T7 is coupled to an (i+1)-th fourth scan line GWLj+1, but the inventive concept is not limited to this example. For example, in an embodiment, the control electrode of the seventh transistor T7 may be coupled to an (i−1)-th fourth scan line GWLj−1.

Next, the emission control signal EMj supplied from the emission control line EMLj may be changed from a high level to a low level during a light-emitting period. During the light-emitting period, the fifth transistor T5 and the sixth transistor T6 may be turned on by the emission control signal EMj of the low level. Then, the driving current Id may be produced by a voltage difference between the first driving voltage ELVDD and the gate voltage T1V of the gate electrode of the first transistor T1 and may be supplied to the light-emitting diode ED through the sixth transistor T6. As a result, a current Ied may pass through the light-emitting diode ED.

Figure 7:
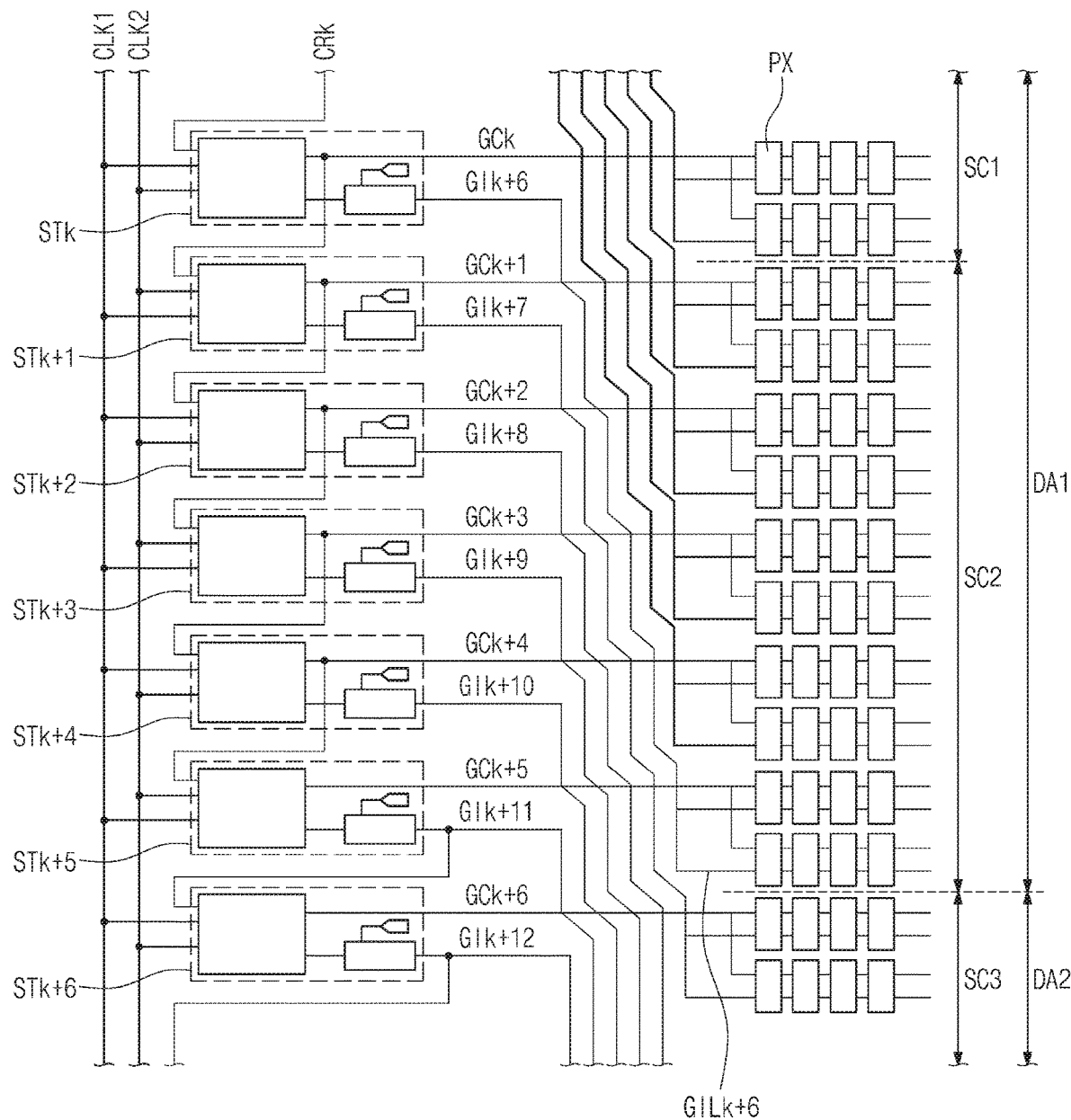
FIG. 7 is a block diagram illustrating a portion of a display device according to an embodiment of the inventive concept.

FIG. 7 is a block diagram illustrating a portion of a display device according to an embodiment of the inventive concept. In detail, FIG. 7 is a block diagram illustrating the first scan driving circuit SD1 (e.g., see FIG. 4) and the pixels PX.

Referring to FIGS. 4 and 7, the first scan driving circuit SD1 may include a plurality of stages. Seven stages STk, STk+1, STk+2, STK+3, STk+4, STk+5, and STk+6 illustrated in FIG. 7 may be some of the stages of the plurality of stages.

The stages STk, STk+1, STk+2, STK+3, STk+4, STk+5, and STk+6 may output first scan signals GIk+6, GIk+7, GIk+8, GIk+9, GIk+10, GIk+11, and GIk+12, respectively, and may output second scan signals GCk, GCk+1, GCk+2, GCk+3, GCk+4, GCk+5, and GCk+6, respectively.

The k-th stage STk may output the first scan signal GIk+6 and the second scan signal GCk to the pixels PX which are provided in the first display region DAL The (k+1)-th to (k+5)-th stages STk+1 to STk+5 may output the first scan signals GIk+7, GIk+8, GIk+9, GIk+10, and GIk+11 respectively to the pixels PX which are provided in the second display region DA2, and may output the second scan signals GCk+1, GCk+2, GCk+3, GCk+4, GCk+5, and GCk+6 respectively to the pixels PX which are provided in the first display region DAL The (k+6)-th stage STk+6 may output the first scan signal GIk+12 and the second scan signal GCk+6 to the pixels PX which are provided in the second display region DA2.

If one of the stages is used to output both of the first and second scan signals to the pixels PX in the first display region DA1, such a stage may be referred to as a first stage. If one of the stages is used to output the first scan signal to the pixels PX in the second display region DA2 and to output the second scan signal to the pixels PX in the first display region DA1, such a stage may be referred to as a second stage. In addition, if one of the stages is used to output both of the first and second scan signals to the pixels PX in the second display region DA2, such a stage may be referred to as a third stage.

The first display region DA1 may include a first sub-region SC1, in which the pixels PX connected to the first stage are provided, and a second sub-region SC2, in which the pixels PX connected to the second stage are provided. A pixel PX connected to the third stage may be disposed in the second display region DA2, and in this case, the second display region DA2 may be referred to as a third sub-region SC3.

Figure 8A:
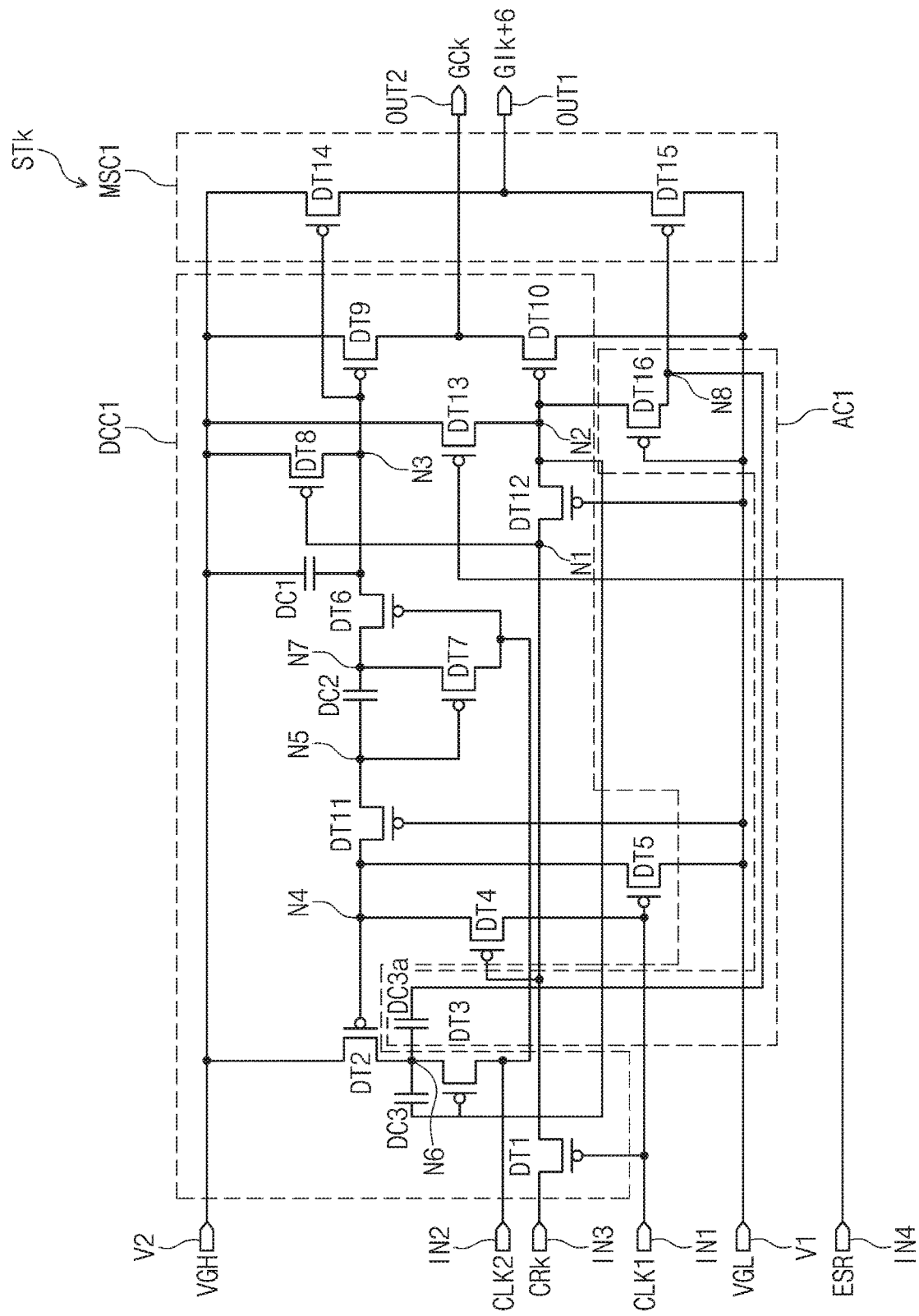
FIG. 8A is a circuit diagram illustrating a k-th stage in a first scan driving circuit according to an embodiment of the inventive concept.

FIG. 8A is a circuit diagram illustrating a k-th stage in a first scan driving circuit according to an embodiment of the inventive concept.

Referring to FIGS. 7 and 8A, if one of the stages in the first scan driving circuit is used to output the first scan signal and the second scan signal to the pixels PX in the first display region DA1, it may have the same circuit structure as the k-th stage STk.

The k-th stage STk may include a driving circuit DCC1, a masking circuit MSC1, an auxiliary circuit AC1, first to fourth input terminals IN1-IN4, a first output terminal OUT1, and a second output terminal OUT2.

The k-th stage STk may receive a first clock signal CLK1, a second clock signal CLK2, a carry signal CRk, and a reset signal ESR, respectively, through the first to fourth input terminals IN1-IN4. The k-th stage STk may receive a first voltage VGL and a second voltage VGH, respectively, through a first voltage terminal V1 and a second voltage terminal V2. The masking circuit MSC1 may output the first scan signal GIk+6 through the first output terminal OUT1, and the driving circuit DCC1 may output the second scan signal GCk through the second output terminal OUT2.

The k-th stage STk may receive a second scan signal GCk−1, which is output through the second output terminal OUT2 of an (k−1)-th stage, as the carry signal CRk. The (k+1)-th stage STk+1 may receive the second scan signal GCk, which is output through the second output terminal OUT2 of the k-th stage STk, as a carry signal. Here, the first stage may receive a start signal as the carry signal.

In some (e.g., odd-numbered stages) of the stages, a first input terminal IN1 may receive the first clock signal CLK1 and a second input terminal IN2 may receive the second clock signal CLK2. In others (e.g., even-numbered stages) of the stages, the first input terminal IN1 may receive the second clock signal CLK2, and the second input terminal IN2 may receive the first clock signal CLK1.

The driving circuit DCC1 may include transistors DT1-DT13 and capacitors DC1, DC2, and DC3.

The transistor DT1 may be connected between a third input terminal IN3 and a first node N1 and may include a gate electrode connected to the first input terminal IN1. The transistor DT2 may be connected between the second voltage terminal V2 and a sixth node N6 and may include a gate electrode connected to a fourth node N4. The transistor DT3 may be connected between the sixth node N6 and the second input terminal IN2 and may include a gate electrode connected to a second node N2.

The transistor DT4 may be connected between the fourth node N4 and the first input terminal IN1, and may include a gate electrode connected to the first node N1. In an embodiment, a plurality of the transistors DT4 may be connected between the fourth node N4 and the first input terminal IN1. In this case, the transistors DT4 may be connected in series between the fourth node N4 and the first input terminal IN1, and each of the transistors DT4 may include a gate electrode connected to the first node N1.

The transistor DT5 may be connected between the fourth node N4 and the first voltage terminal V1 and may include a gate electrode connected to the first input terminal IN1. The transistor DT6 may be connected between a third node N3 and a seventh node N7 and may include a gate electrode connected to the second input terminal IN2. The transistor DT7 may be connected between the seventh node N7 and the second input terminal IN2 and may include a gate electrode connected to a fifth node N5.

The transistor DT8 may be connected between the second voltage terminal V2 and the third node N3 and may include a gate electrode connected to the first node N1. The transistor DT9 may be connected between the second voltage terminal V2 and the second output terminal OUT2 and may include a gate electrode connected to the third node N3.

The transistor DT10 may be connected between the second output terminal OUT2 and the first voltage terminal V1 and may include a gate electrode connected to the second node N2. The transistor DT10 may be referred to as an output transistor.

The transistor DT11 may be connected between the fourth node N4 and the fifth node N5 and may include a gate electrode connected to the first voltage terminal V1. The transistor DT12 may be connected between the first node N1 and the second node N2 and may include a gate electrode connected to the first voltage terminal V1. The transistor DT13 may be connected between the second voltage terminal V2 and the second node N2 and may include a gate electrode connected to the fourth input terminal IN4. The fourth input terminal IN4 may receive the reset signal ESR.

The reset signal ESR may be a signal that is activated to a low level when the display device DD (e.g., see FIG. 1) is brought into an initial power-on state or a reset state. When the reset signal ESR is changed to its low level, the transistor M13 may be turned on, and the second node N2 and an eighth node N8 may be maintained to a voltage level (i.e., a high level) of the second voltage VGH.

The capacitor DC1 may be connected between the second voltage terminal V2 and the third node N3. The capacitor DC2 may be connected between the fifth node N5 and the seventh node N7. The capacitor DC3 may be connected between the sixth node N6 and the second node N2.

The masking circuit MSC1 may include masking transistors DT14 and DT15. The masking transistor DT14 may be connected between the second voltage terminal V2 and the first output terminal OUT1 and may include a gate electrode connected to the third node N3. The masking transistor DT15 may be connected between the first voltage terminal V1 and the first output terminal OUT1 and may include a gate electrode connected to the eighth node N8. Hereinafter, the masking transistor DT15 may be referred to as an output masking transistor. The masking circuit MSC1 may output the second voltage VGH as the first scan signal GIk+6.

The auxiliary circuit AC1 may include a transistor DT16 and a capacitor DC3a. Hereinafter, the transistor DT16 may be referred to as an auxiliary transistor. The auxiliary transistor DT16 may be connected between the second node N3 and the eighth node N8 and may include a gate electrode connected to the first voltage terminal V1.

The auxiliary transistor DT16 may be connected between the gate electrode of the output transistor DT10 and the gate electrode of the output masking transistor DT15. In other words, the second node N2 connected to the gate electrode of the output transistor DT10 and the eighth node N8 connected to the gate electrode of the output masking transistor DT15 may be separated from each other by the auxiliary transistor DT16. The second node N2 may be referred to as a first Q node, and the eighth node N8 may be referred to as a second Q node.

The k-th stage STk may be a circuit that is configured to output the first scan signal GIk+6 and the second scan signal GCk to the first display region DA1. Thus, even when the display device DD (e.g., see FIG. 1) is operated in the first mode MD1 (e.g., see FIG. 3A) or the second mode MD2 (e.g., see FIG. 3A), the k-th stage STk may activate each of the first and second scan signals GIk+6 and GCk every frame. For example, in the case where the first display region DA1 is operated with a driving frequency of 120 Hz, the k-th stage STk may activate each of the first and second scan signals GIk+6 and GCk every 8.34 milliseconds, but the inventive concept is not limited to this example. For example, an interval between periods, in which each of the first and second scan signals GIk+6 and GCk is activated, may depend on the driving frequency.

The capacitor DC3a may be connected between the sixth node N6 and the eighth node N8. Hereinafter, the capacitor DC3a may be referred to as an auxiliary capacitor. The auxiliary capacitor DC3a may be connected to the capacitor DC3 and the sixth node N6. The auxiliary capacitor DC3a and the capacitor DC3 may have the same size. For example, the auxiliary capacitor DC3a and the capacitor DC3 may have the same capacitance. Thus, although the eighth node N8 is separated from the second node N2, the voltage levels of the second and eighth nodes N2 and N8 may be changed in synchronization with the same signal.

For example, when the transistor DT3 is turned on and the second clock signal CLK2 is falling to a low level due to the capacitor DC3 connected between the sixth node N6 and the second node N2, a voltage of the second node N2 may be lowered to a level that is lower than a voltage level of the carry signal CRk. In addition, due to the auxiliary capacitor DC3a connected to the sixth node N6 and the eighth node N8, a voltage of the eighth node N8 may also be lowered to a level that is lower than the voltage level of the carry signal CRk.

Figure 8B:
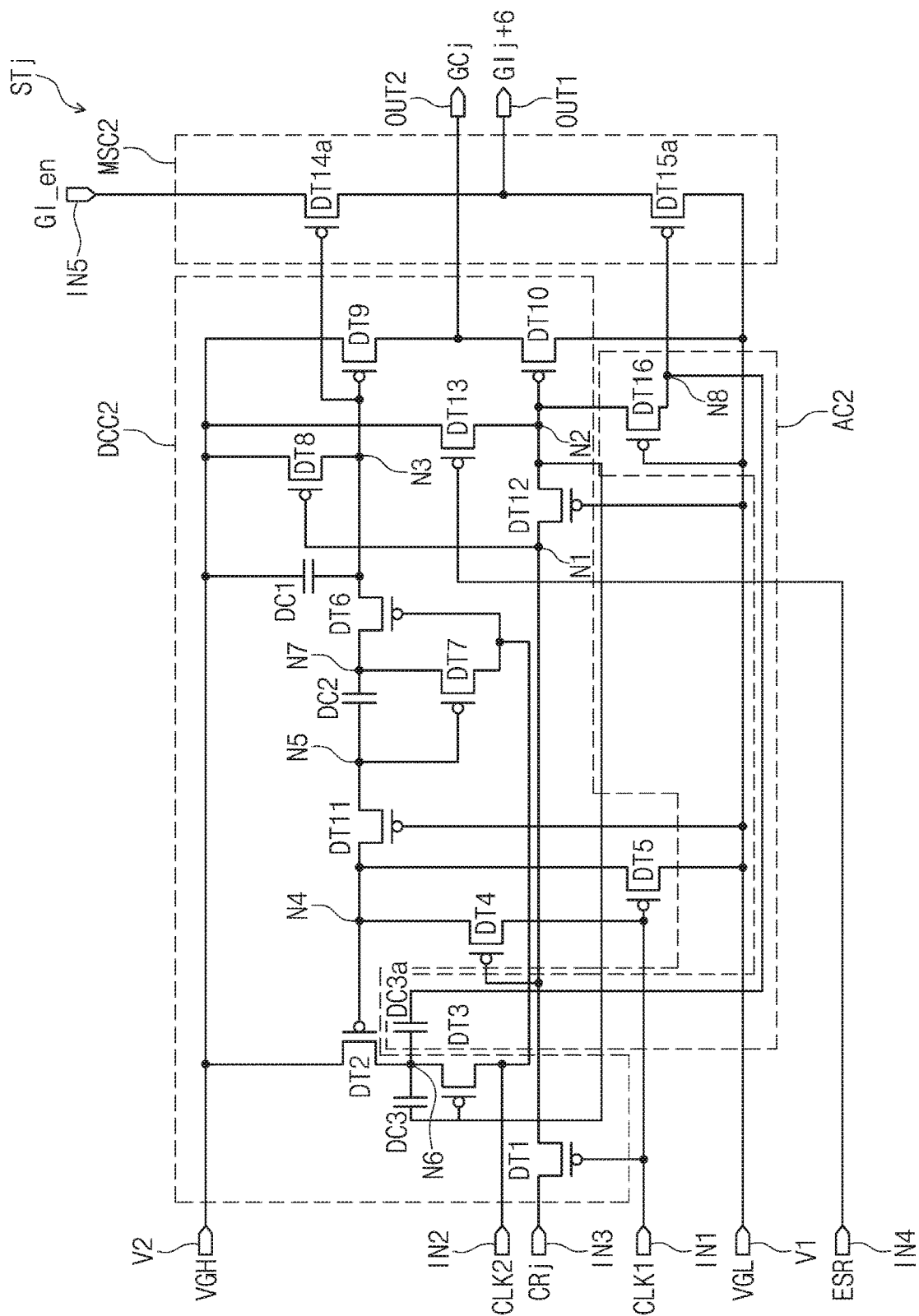
FIG. 8B is a circuit diagram illustrating a j-th stage in a first scan driving circuit according to an embodiment of the inventive concept.

FIG. 8B is a circuit diagram illustrating a j-th stage in a first scan driving circuit according to an embodiment of the inventive concept.

Referring to FIGS. 7 and 8B, a j-th stage STj may be one of the (k+1)-th to (k+5)-th stages STk+1 to STk+5. If one of the stages provided in the first scan driving circuit is used to output the first scan signal to the pixels PX in the second display region DA2 and to output the second scan signal to the pixels PX in the first display region DA1, such a stage may have the same circuit structure as the j-th stage STj.

The j-th stage STj may include a driving circuit DCC2, a masking circuit MSC2, an auxiliary circuit AC2, first to fifth input terminals IN1-IN5, the first output terminal OUT1, and the second output terminal OUT2.

Each of the driving circuit DCC2, the auxiliary circuit AC2, the first to fourth input terminals IN1-IN4, the first output terminal OUT1, and the second output terminal OUT2 may be configured to have the same structure as the corresponding element previously described with reference to FIG. 8A, and thus, a detailed description thereof will be omitted.

The masking circuit MSC2 may include masking transistors DT14a and DT15a. The masking transistor DT14a may be connected between the fifth input terminal IN5 and the first output terminal OUT1 and may include a gate electrode connected to the third node N3. The fifth input terminal IN5 may receive a masking signal GI_en. Masking transistor DT15a may be connected between the first voltage terminal V1 and the first output terminal OUT1 and may include a gate electrode connected to the eighth node N8. Hereinafter, the masking transistor DT15a may be referred to as an output masking transistor. The masking circuit MSC2 may execute an operation of masking a first scan signal GIj+6 to a specific level in response to the masking signal GI_en.

The auxiliary circuit AC2 may include the transistor DT16 and the capacitor DC3a. Hereinafter, the transistor DT16 may be referred to as an auxiliary transistor. The auxiliary transistor DT16 may be connected between the second node N2 and the eighth node N8 and may include a gate electrode connected to the first voltage terminal V1.

The auxiliary transistor DT16 may be connected between the gate electrode of the output transistor DT10 and the gate electrode of the output masking transistor DT15a. In other words, the second node N2, which is connected to the gate electrode of the output transistor DT10, and the eighth node N8, which is connected to the gate electrode of the output masking transistor DT15a, may be separated from each other by the auxiliary transistor DT16. The second node N2 may be referred to as a first Q node, and the eighth node N8 may be referred to as a second Q node.

The j-th stage STj may be a circuit that is configured to output the first scan signal GIj+6 to the second display region DA2 and to output the second scan signal GCj to the first display region DA1. Thus, depending on an operation mode of the display device DD (e.g., see FIG. 1), an interval between periods, in which the first scan signal GIj+6 is activated by the j-th stage STj, may differ from an interval between periods, in which the second scan signal GCj is activated.

For example, in the case where, in the first mode MD1 (e.g., see FIG. 3A), the first display region DA1 and the second display region DA2 are operated with a driving frequency of 120 Hz, the j-th stage STj may activate each of the first scan signal GIj+6 and the second scan signal GCj every 8.34 milliseconds. In the case where, in the second mode MD2 (e.g., see FIG. 3B), the first display region DA1 is operated with a driving frequency of 120 Hz and the second display region DA2 is operated with a driving frequency of 1 Hz, the j-th stage STj may activate the first scan signal GIj+6 every 1 second and may activate the second scan signal GCj every 8.34 milliseconds. That is, in a specific interval, only the second scan signal GCj may be activated, and the first scan signal GIj+6 may be maintained to its inactivated state.

In the case where, unlike the structure according to an embodiment of the inventive concept, the gate electrode of the transistor DT10 and the gate electrode of the output masking transistor DT15a are connected to the same Q node, a difference in voltage of the Q node may occur by a gate-source parasitic capacitor of the transistor DT10 and a gate-source parasitic capacitor of the output masking transistor DT15a. In detail, the voltage of the Q node when both of the second scan signal GCj and the first scan signal GIj+6 are activated may have different value than the voltage of the Q node when the second scan signal GCj is activated but the first scan signal GIj+6 is not activated. Thus, there may be a variation in the voltage level of the activated second scan signal GCj, depending on an activation state of the first scan signal GIj+6. This may lead to a variation in the voltage T1V that is applied to the gate electrode of the first transistor T1 (e.g., see FIGS. 5 and 6). That is, even when the same data voltage is input, the pixel may exhibit a brightness property that depends on the activation state of the first scan signal GIj+6.

According to an embodiment of the inventive concept, the gate electrode of the transistor DT10 and the gate electrode of the output masking transistor DT15a may be separated from each other by the auxiliary transistor DT16. The gate electrode of the auxiliary transistor DT16 may be connected to the first voltage terminal V1, thereby preserving its turn-on state. If the auxiliary transistor DT16 can be maintained to its turn-on state, the gate electrode of the auxiliary transistor DT16 may be connected to another terminal other than the first voltage terminal V1.

According to an embodiment of the inventive concept, the gate electrode of the output transistor DT10 and the gate electrode of the output masking transistor DT15a may be connected to different nodes (e.g., the second and eighth nodes N2 and N8), respectively. Thus, it may be possible to diminish or reduce influence of the activation state of the first scan signal GIj+6 on the second node N2 connected to the gate electrode of the transistor DT10. As a result, it may be possible to minimize the difference in the voltage level of the second scan signal GCj between when the first scan signal GIj+6 is activated and when the first scan signal GIj+6 is masked to be an inactivated state. Thus, the variation of the voltage T1V (e.g., see FIG. 6), which is applied to the gate electrode of the first transistor T1 (e.g., see FIG. 5), may also be reduced, and furthermore, it may be possible to prevent the brightness property from varying depending on an activation state of the first scan signal GIj+6, even when the same data voltage is input.

Figure 9:
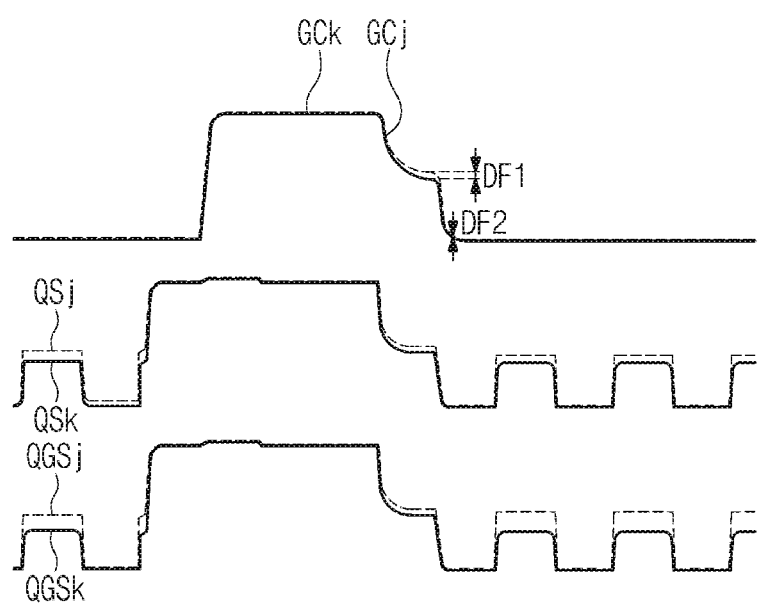
FIG. 9 is a waveform diagram illustrating signals in a first scan driving circuit according to an embodiment of the inventive concept.

FIG. 9 is a waveform diagram illustrating signals in a first scan driving circuit according to an embodiment of the inventive concept.

Referring to FIGS. 8A, 8B, and 9, FIG. 9 shows the waveforms of the second scan signals GCk and GCj, which are output from the k-th stage STk and the j-th stage STj, the waveforms of the first signals QSk and QSj, which are measured at the second node N2 of the k-th stage STk and the second node N2 of the j-th stage STj, and the waveforms of the second signals QSk and QSj, which are measured at the eighth node N8 of the k-th stage STk and the eighth node N8 of the j-th stage STj, when the display device DD (e.g., see FIG. 1) is operated in the second mode MD2 (e.g., see FIG. 3B).

A first difference DF1 and a second difference DF2, which are associated with the waveforms of the second scan signals GCk and GCj, are illustrated in FIG. 9. The first difference DF1 is a difference between the second scan signals GCk and GCj measured when they change from their high levels to their intermediate levels, and the second difference DF2 is a difference between the second scan signals GCk and GCj measured when they change from their intermediate levels to their low levels.

According to an embodiment of the inventive concept, since the second and eighth nodes N2 and N8 are separated from each other, it may be possible to diminish or reduce a variation in voltage level of the second node N2 caused by an activation state of the first scan signal GIj+6. Thus, the first difference DF1 was reduced by a voltage of 1.3 V, compared with the case that the gate electrode of the transistor DT10 and the gate electrode of the output masking transistor DT15a are connected to the same node, and the second difference DF2 was reduced by a voltage of 0.4 V, compared with the case that the gate electrode of the transistor DT10 and the gate electrode of the output masking transistor DT15a are connected to the same node. Accordingly, it may be possible to reduce a difference in voltage between the second scan signals GCk and GCj caused by the activation state of the first scan signal GIj+6.

When the gate electrode of the transistor DT10 and the gate electrode of the output masking transistor DT15a are connected to the same node unlike the embodiment of the inventive concept, the first and second differences DF1 and DF2 between the second scan signals GCk and GCj caused by the activation state of the first scan signal GIj+6 were 2 V and 1 V, respectively. When data voltages corresponding to 127 gradation levels were applied, a difference in brightness between pixels driven by the second scan signals GCk and GCj, respectively, was about 1.6 percent.

By contrast, in the case where the auxiliary transistor DT16 is added between the gate electrode of the transistor DT10 and the gate electrode of the output masking transistor DT15a to connect the gate electrode of the transistor DT10 and the gate electrode of the output masking transistor DT15a to different nodes separated by the auxiliary transistor DT16 as in the embodiment of the inventive concept, a difference in brightness between pixels driven by the second scan signals GCk and GCj, respectively, was about 0.1 percent that could not be recognized by a user, when the data voltages corresponding to 127 gradation levels were applied thereto. That is, according to an embodiment of the inventive concept, it may be possible to reduce a difference in brightness between the pixels disposed in the first sub-region SC1 (e.g., see FIG. 7) and the pixels disposed in the second sub-region SC2 (e.g., see FIG. 7) when the same data voltage is applied.

Figure 10A:
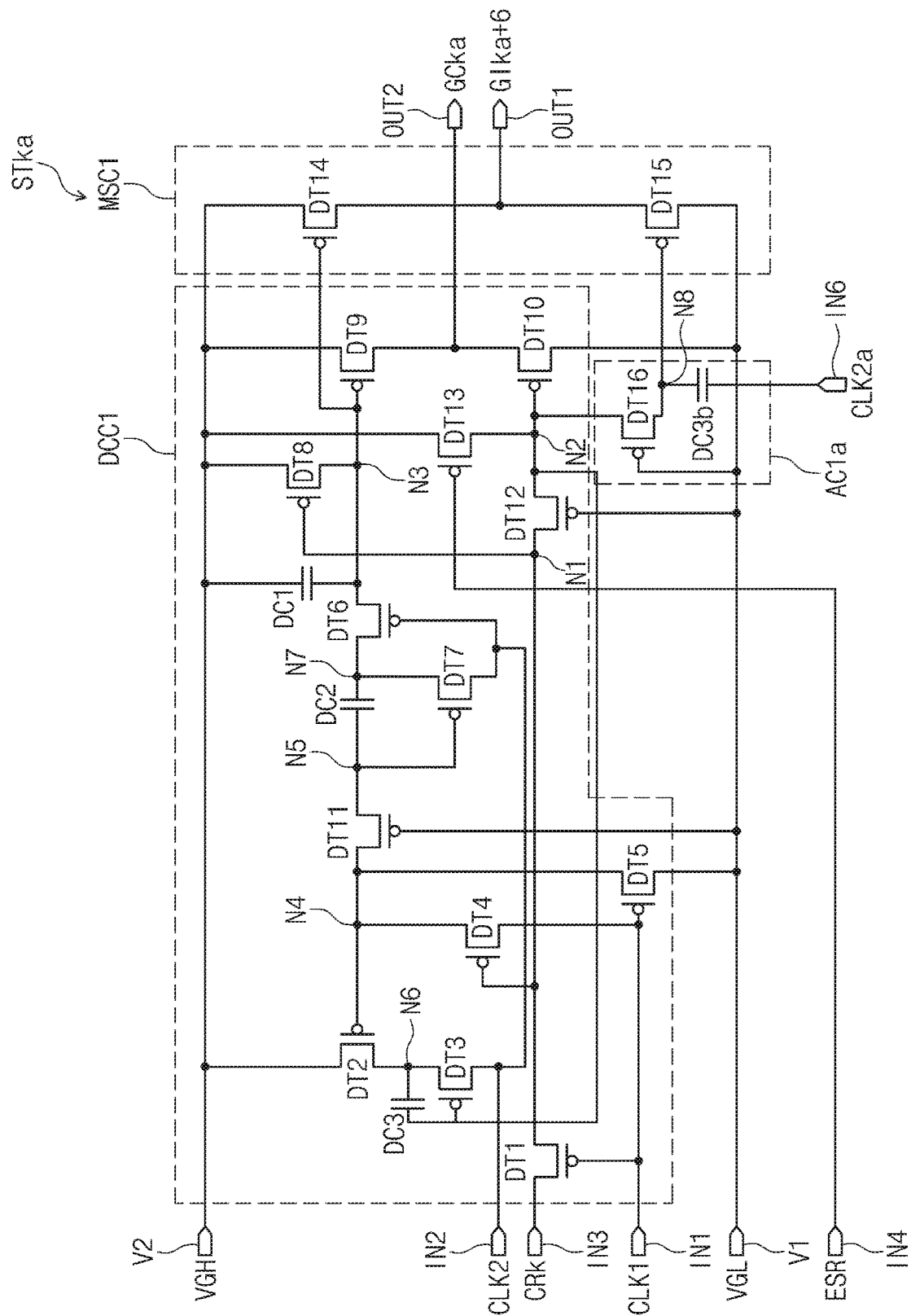
FIG. 10A is a circuit diagram illustrating a k-th stage in a first scan driving circuit according to an embodiment of the inventive concept.
Figure 10B:
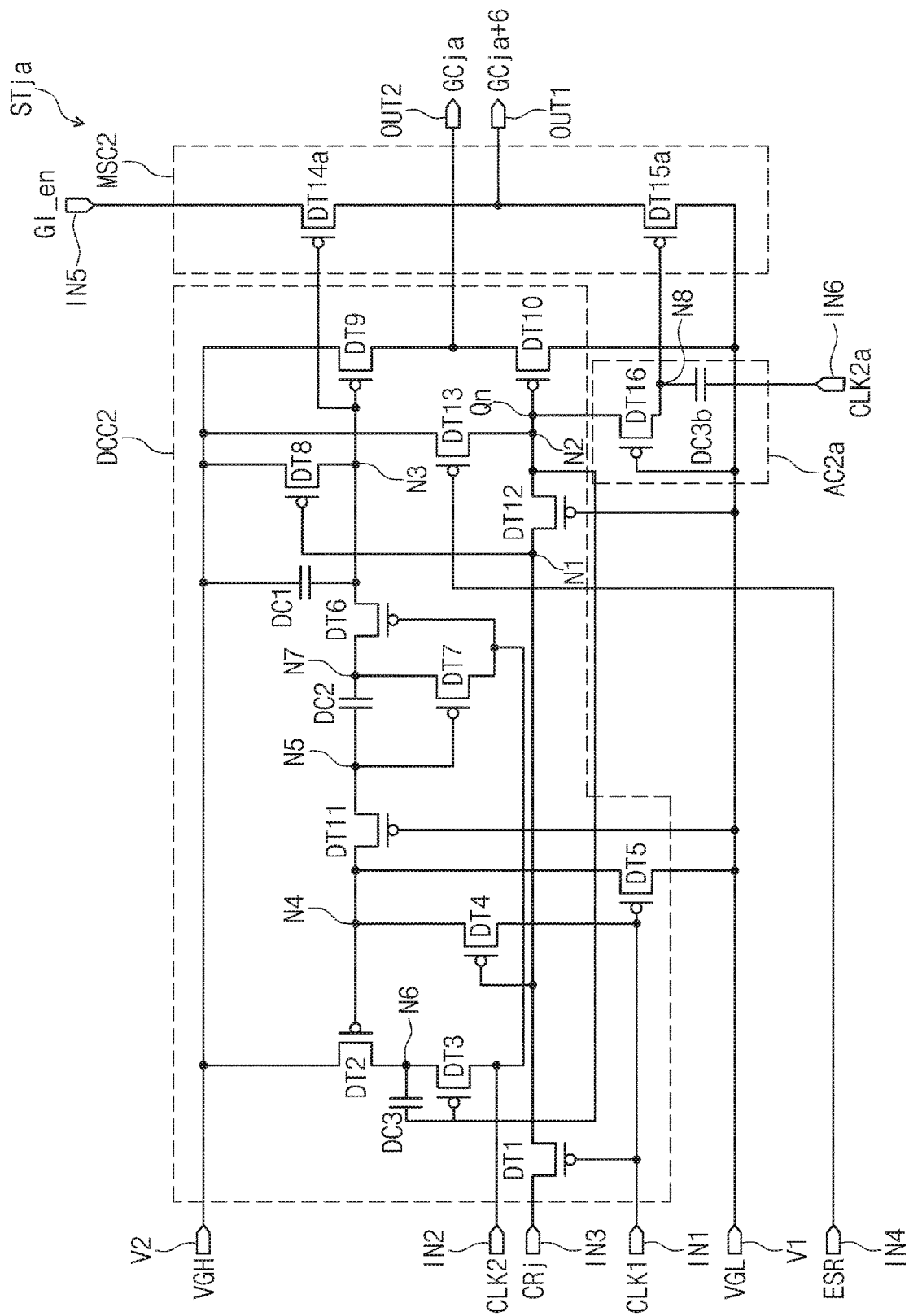
FIG. 10B is a circuit diagram illustrating a j-th stage in a first scan driving circuit according to an embodiment of the inventive concept.

FIG. 10A is a circuit diagram illustrating a k-th stage in a first scan driving circuit according to an embodiment of the inventive concept. FIG. 10B is a circuit diagram illustrating a j-th stage in a first scan driving circuit according to an embodiment of the inventive concept. In the following description of FIGS. 10A and 10B, an element previously described with reference to FIGS. 8A and 8B may be identified by the same reference number without repeating an overlapping description thereof, for the sake of brevity.

Referring to FIG. 10A, the k-th stage STka may include the driving circuit DCC1, the masking circuit MSC1, the auxiliary circuit AC1a, the first to fourth input terminals IN1-IN4, the first output terminal OUT1, the second output terminal OUT2, and a sixth input terminal IN6. The k-th stage STka may output a first scan signal Glka+6 through the first output terminal OUT1 and may output the second scan signal GCka through the second output terminal OUT2.

Referring to FIG. 10B, the j-th stage STja may include the driving circuit DCC2, the masking circuit MSC2, the auxiliary circuit AC2a, first to sixth input terminals IN1-IN6, the first output terminal OUT1, and the second output terminal OUT2. The j-th stage STja may output a first scan signal GIja+6 through the first output terminal OUT1 and may output the second scan signal GCja through the second output terminal OUT2. The masking circuit MSC2 of the j-th stage STja may mask the first scan signal GIja+6 to a specific level in response to the masking signal GI_en.

Referring to FIGS. 10A and 10B, each of the auxiliary circuits AC1a and AC2a may include the auxiliary transistor DT16 and an auxiliary capacitor DC3b.

The auxiliary transistor DT16 may be connected between the second node N2 and the eighth node N8 and may include a gate electrode connected to the first voltage terminal V1. The auxiliary transistor DT16 may be connected between the gate electrode of the output transistor DT10 and the gate electrode of the output masking transistor DT15. In other words, the second node N2, which is connected to the gate electrode of the output transistor DT10, and the eighth node N8, which is connected to the gate electrode of the output masking transistor DT15a, may be separated from each other by the auxiliary transistor DT16.

The auxiliary capacitor DC3b may be connected between the eight node N8 and the sixth input terminal IN6. The auxiliary capacitor DC3b may have substantially the same size as that of the capacitor DC3. For example, the auxiliary capacitor DC3b and the capacitor DC3 may have the same capacitance. In addition, the auxiliary capacitor DC3b may receive the second clock signal CLK2a through the sixth input terminal IN6. The second clock signal CLK2a may have the same waveform as the second clock signal CLK2 received through the second input terminal IN2. Thus, although the eighth node N8 is separated from the second node N2 by the auxiliary transistor DT16, the voltage levels of the second node N2 and the eighth node N8 may be changed in synchronization with the same waveform.

Figure 11:
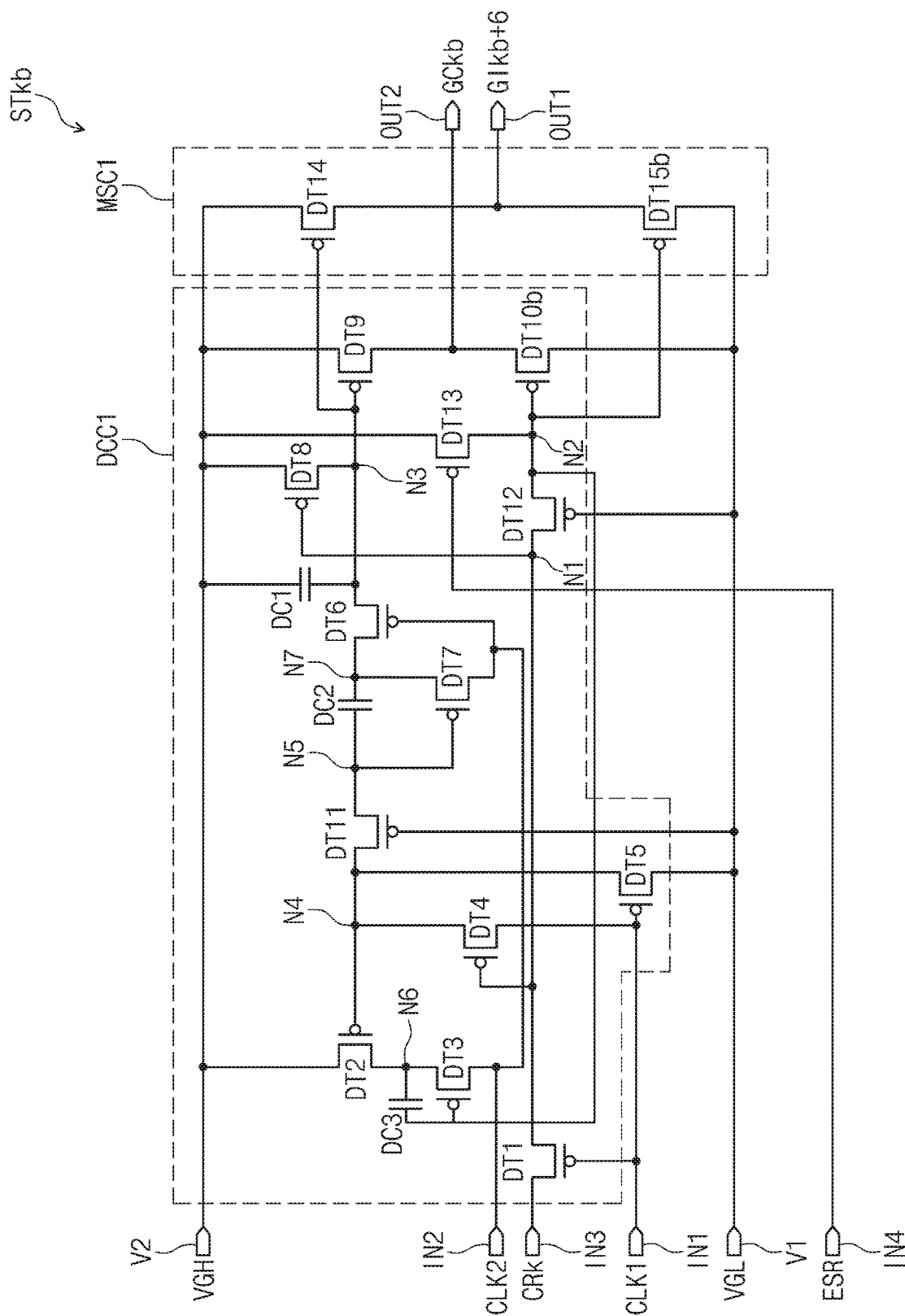
FIG. 11 is a circuit diagram illustrating a k-th stage in a first scan driving circuit according to an embodiment of the inventive concept.

FIG. 11 is a circuit diagram illustrating a k-th stage in a first scan driving circuit according to an embodiment of the inventive concept. In the following description of FIG. 11, an element previously described with reference to FIG. 8A may be identified by the same reference number without repeating an overlapping description thereof, for the sake of brevity.

Referring to FIG. 11, the k-th stage STkb may include the driving circuit DCC1, the masking circuit MSC1, the first to fourth input terminals IN1-IN4, the first output terminal OUT1, and the second output terminal OUT2. The k-th stage STkb may output a first scan signal Glkb+6 through the first output terminal OUT1 and may output the second scan signal GCkb through the second output terminal OUT2.

The k-th stage STkb may be a circuit that is configured to output the first scan signal Glkb+6 and the second scan signal GCkb to the first display region DA1 (e.g., see FIG. 1). In other words, the masking circuit of the k-th stage STkb may not perform the masking operation on the first scan signal Glkb+6. Thus, the gate electrode of the output masking transistor DT15b may be connected to the same node (e.g., the second node N2) as a gate electrode of a transistor DT10b of a stage, which is used to output both of the first and second scan signals Glkb+6 and GCkb to the first display region DA1 (e.g., see FIG. 1), among the plurality of stages.

According to an embodiment of the inventive concept, an output masking transistor connected to a first output terminal and an output transistor connected to a second output terminal may have respective gate electrodes which are separated from each other by an auxiliary transistor and are connected to different nodes. Thus, it may be possible to diminish or reduce a variation in a voltage of a node connected to the gate electrode of the output transistor which is caused by an activation state of a first scan signal output through the first output terminal. As a result, it may be possible to minimize a difference in a second scan signal, which is output from the second output terminal, between when the first scan signal is activated and when the first scan signal is masked or inactivated. Thus, it may be possible to prevent a brightness property of the display device from varying depending on an activation state of the first scan signal even when the same data voltage is applied, and thereby to improve an image quality of the display device.

While example embodiments of the inventive concept have been particularly shown and described, it will be understood by one of ordinary skill in the art that variations in form and detail may be made therein without departing from the spirit and scope of the attached claims.

What is claimed is:

1. A display device, comprising:
   a display panel including a plurality of data lines, a plurality of first scan lines, a plurality of second scan lines, and a plurality of pixels;
   a data driving circuit providing a plurality of data voltages to the plurality of data lines;
   a scan driving circuit including a plurality of stages and outputting a plurality of first scan signals to the plurality of first scan lines and outputting a plurality of second scan signals to the plurality of second scan lines; and
   a driving controller controlling the data driving circuit and the scan driving circuit,
   wherein each of the plurality of stages comprises:
   a masking circuit outputting a first scan signal to a first output terminal, the masking circuit including an output masking transistor comprising a first gate electrode, a first electrode connected to the first output terminal and a second electrode connected to a first voltage terminal;
   a driving circuit outputting a second scan signal to a second output terminal, the driving circuit including an output transistor comprising a second gate electrode, a third electrode connected to the second output terminal and a fourth electrode connected to the first voltage terminal; and
   an auxiliary circuit including an auxiliary transistor which is a normally turned-on state and connected between the masking circuit and the driving circuit,
   wherein the auxiliary transistor comprises a fifth electrode connected to the first gate electrode of the output masking transistor, a sixth electrode connected to the second gate electrode of the output transistor, and a third gate electrode connected to the first voltage terminal, and
   wherein the second electrode of the output masking transistor, the fourth electrode of the output transistor, and the third gate electrode of the auxiliary transistor are connected to the first voltage terminal receiving a first voltage which is a constant voltage.

2. The display device of claim 1, wherein the second gate electrode of the output transistor is connected to a first Q node, and
   wherein the first gate electrode of the output masking transistor is connected to a second Q node that is different from the first Q node.

3. The display device of claim 2, wherein the auxiliary transistor is connected between the first Q node and the second Q node.

4. The display device of claim 2, wherein the driving circuit further comprises a capacitor connected to the first Q node, and
   the auxiliary circuit further comprises an auxiliary capacitor connected to the second Q node.

5. The display device of claim 4, wherein the capacitor and the auxiliary capacitor have the same size.

6. The display device of claim 4, wherein a first electrode of the capacitor is connected to the first Q node,
   a first electrode of the auxiliary capacitor is connected to the second Q node, and
   a second electrode of the capacitor is connected to a second electrode of the auxiliary capacitor.

7. The display device of claim 2, wherein the display panel comprises a first display region which is operated with a first driving frequency and a second display region which is operated with the first driving frequency or a second driving frequency which is different from the first driving frequency depending on an operation mode of the display device.

8. The display device of claim 7, wherein the plurality of stages comprises a first stage, a second stage, and a third stage,
   wherein the first stage outputs a first-first scan signal and a first-second scan signal to the first display region, the second stage outputs a second-first scan signal to the second display region and outputs a second-second scan signal to the first display region, and the third stage outputs a third-first scan signal and a third-second scan signal to the second display region.

9. The display device of claim 8, wherein the second stage is configured to activate the second-second scan signal and to inactivate the second-first scan signal when the first display region is operated with the first driving frequency and the second display region is operated with the second driving frequency lower than the first driving frequency.

10. The display device of claim 8, wherein the masking circuit of the first stage further comprises a masking transistor that is connected between a second voltage terminal which receives a second voltage different from the first voltage and the first output terminal.

11. The display device of claim 8, wherein the masking circuit of each of the second and third stages further comprises a masking transistor that is connected between an input terminal which receives a masking signal controlling an operation of the masking circuit and the first output terminal.

12. A display device, comprising:
    a display panel including a display region, the display panel comprising a plurality of first scan lines receiving a plurality of first scan signals, respectively, a plurality of second scan lines receiving a plurality of second scan signals, respectively, a plurality of data lines, and a plurality of pixels, the display region comprising a first display region which is operated with a first driving frequency and a second display region which is operated with the first driving frequency or a second driving frequency depending on an operation mode of the display device, the first driving frequency and the second driving frequency being different from each other;
    a first stage outputting a first-first scan signal and a first-second scan signal to the first display region;
    a second stage outputting a second-first scan signal to the second display region and outputting a second-second scan signal to the first display region; and
    a third stage outputting a third-first scan signal and a third-second scan signal to the second display region,
    wherein the second stage comprises a masking circuit outputting the second-first scan signal to a first output terminal, a driving circuit outputting the second-second scan signal to a second output terminal, and an auxiliary circuit including an auxiliary transistor which is connected between the masking circuit and the driving circuit,
    wherein the driving circuit comprises an output transistor comprising a first gate electrode, a first electrode connected to the second output terminal and a second electrode connected to a first voltage terminal,
    wherein the masking circuit comprises an output masking transistor comprising a second gate electrode, a third electrode connected to the first output terminal and a fourth electrode connected to the first voltage terminal, wherein the auxiliary transistor comprises a fifth electrode connected to the first gate electrode of the output transistor, a sixth electrode connected to the second gate electrode of the output masking transistor, and a third gate electrode connected to the first voltage terminal, and wherein the second electrode of the output transistor, the fourth electrode of the output masking transistor, and the third gate electrode of the auxiliary transistor are connected to the first voltage terminal receiving a first voltage which is a constant voltage.

13. The display device of claim 12, wherein the first gate electrode of the output transistor is connected to a first Q node, and wherein the second gate electrode of the output masking transistor is connected to a second Q node different from the first Q node.

14. The display device of claim 13, wherein the auxiliary transistor is connected between the first Q node and the second Q node.

15. The display device of claim 13, wherein the driving circuit further comprises a capacitor connected to the first Q node and the auxiliary circuit further comprises an auxiliary capacitor connected to the second Q node, and wherein the capacitor and the auxiliary capacitor have the same size.

16. The display device of claim 15, wherein a first electrode of the capacitor is connected to the first Q node, a first electrode of the auxiliary capacitor is connected to the second Q node, and a second electrode of the capacitor is connected to a second electrode of the auxiliary capacitor.

17. An electronic device, comprising:

a display panel including a plurality of data lines, a plurality of first scan lines, a plurality of second scan lines, and a plurality of pixels;

a data driving circuit providing a plurality of data voltages to the plurality of data lines; and a scan driving circuit outputting a plurality of first scan signals to the plurality of first scan lines, outputting a plurality of second scan signals to the plurality of second scan lines, and comprising a plurality of stages, wherein each of the plurality of stages comprises:

a masking circuit outputting a first scan signal to a first output terminal and comprising an output masking transistor comprising a first gate electrode, a first electrode connected to the first output terminal and a second electrode connected to a first voltage terminal receiving a first voltage which is a constant voltage;

a driving circuit outputting a second scan signal to a second output terminal and comprising an output transistor comprising a second gate electrode, a third electrode connected to the second output terminal and a fourth electrode connected to the first voltage terminal; and an auxiliary circuit including an auxiliary transistor comprising a fifth electrode connected to the first gate electrode of the output masking transistor, a sixth electrode connected to the second gate electrode of the output transistor, and a third gate electrode connected to the first voltage terminal, and an auxiliary capacitor which is connected to the first gate electrode of the output masking transistor, and wherein the second electrode of the output masking transistor, the fourth electrode of the output transistor, and the third gate electrode of the auxiliary transistor are connected to the first voltage terminal receiving a first voltage which is a constant voltage.

18. The electronic device of claim 17, wherein the driving circuit further comprises a capacitor connected to the second gate electrode of the output transistor, and wherein the capacitor and the auxiliary capacitor have the same size.

19. The electronic device of claim 18, wherein the capacitor and the auxiliary capacitor are connected to each other.

20. The electronic device of claim 17, wherein the display panel comprises a first display region which is operated with a first driving frequency and a second display region which is operated with the first driving frequency or a second driving frequency lower than the first driving frequency depending on an operation mode of the display device.

* * * * *